(12) United States Patent
Yuan et al.

(10) Patent No.: US 12,557,539 B2
(45) Date of Patent: Feb. 17, 2026

(54) LIGHT-EMITTING SUBSTRATE AND METHOD FOR MANUFACTURING THE SAME, SOLUTION CONTAINING LIGHT-EMITTING MATERIAL AND LIGHT-EMITTING APPARATUS

(71) Applicant: BOE TECHNOLOGY GROUP CO., LTD., Beijing (CN)

(72) Inventors: Xu Yuan, Beijing (CN); Xiaoyuan Zhang, Beijing (CN); Zhuo Chen, Beijing (CN); Zhuo Li, Beijing (CN); Di Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 399 days.

(21) Appl. No.: 18/249,556

(22) PCT Filed: Apr. 29, 2022

(86) PCT No.: PCT/CN2022/090584
§ 371 (c)(1),
(2) Date: Apr. 19, 2023

(87) PCT Pub. No.: WO2023/206485
PCT Pub. Date: Nov. 2, 2023

(65) Prior Publication Data
US 2024/0381751 A1 Nov. 14, 2024

(51) Int. Cl.
*H10K 59/95* (2023.01)
*H10K 50/115* (2023.01)
(Continued)

(52) U.S. Cl.
CPC ........... *H10K 59/95* (2023.02); *H10K 50/115* (2023.02); *H10K 71/12* (2023.02); *H10K 71/20* (2023.02); *H10K 71/60* (2023.02)

(58) Field of Classification Search
None
See application file for complete search history.

(56) References Cited

U.S. PATENT DOCUMENTS

| 2009/0087792 A1 | 4/2009 | Iizumi et al. |
| 2010/0108984 A1 | 5/2010 | Cho et al. |

(Continued)

FOREIGN PATENT DOCUMENTS

| CN | 105336879 A | 2/2016 |
| CN | 106206972 A | 12/2016 |

(Continued)

OTHER PUBLICATIONS

Coe et al, "Electroluminescence from single monolayers of nanocrystals in molecular organic devices", Nature, vol. 420, Dec. 2020, pp. 800-803.

(Continued)

*Primary Examiner* — Anthony Ho
(74) *Attorney, Agent, or Firm* — Dority & Manning, P.A.

(57) ABSTRACT

A light-emitting substrate includes a substrate and a first light-emitting device. The first light-emitting device includes a first electrode, a first functional layer, a first light-emitting pattern and a second electrode that are sequentially disposed in a direction away from the substrate. The first functional layer is in contact with the first light-emitting pattern. The first light-emitting pattern includes a first light-emitting material. The first light-emitting material includes first light-emitting particles and first ligands combined with the first light-emitting particles. The first functional layer includes a first functional material. The first functional material includes first functional particles and second ligands combined with the first functional particles. A development characteristic of the first ligands is same as a development characteristic of the second ligands.

19 Claims, 10 Drawing Sheets

(51) Int. Cl.
*H10K 71/12* (2023.01)
*H10K 71/20* (2023.01)
*H10K 71/60* (2023.01)

(56) References Cited

U.S. PATENT DOCUMENTS

| | | |
|---|---|---|
| 2016/0351842 A1 | 12/2016 | Park et al. |
| 2018/0149970 A1 | 5/2018 | Lee et al. |
| 2019/0131587 A1 | 5/2019 | Chen |
| 2019/0312204 A1 | 10/2019 | Kang et al. |
| 2020/0343467 A1 | 10/2020 | Li |
| 2021/0066673 A1 | 3/2021 | Zhang et al. |
| 2021/0091325 A1 | 3/2021 | Kim et al. |
| 2021/0135139 A1 | 5/2021 | Lee et al. |
| 2021/0388259 A1 | 12/2021 | Mei et al. |
| 2022/0127525 A1 | 4/2022 | Wang |
| 2022/0310953 A1 | 9/2022 | Li |
| 2022/0399515 A1 | 12/2022 | Yu et al. |
| 2023/0180496 A1 | 6/2023 | Kanehiro et al. |

FOREIGN PATENT DOCUMENTS

| | | |
|---|---|---|
| CN | 106848079 A | 6/2017 |
| CN | 107611021 A | 1/2018 |
| CN | 109841745 A | 6/2019 |
| CN | 111682115 A | 9/2020 |
| CN | 111900269 A | 11/2020 |
| CN | 112234155 A | 1/2021 |
| CN | 112310291 A | 2/2021 |
| CN | 112342013 A | 2/2021 |
| CN | 112750954 A | 5/2021 |
| CN | 113130775 A | 7/2021 |
| CN | 113193133 A | 7/2021 |
| CN | 113206209 A | 8/2021 |
| CN | 113690378 A | 11/2021 |
| CN | 113871544 A | 12/2021 |
| CN | 113950753 A | 1/2022 |
| WO | WO 2020/142480 A1 | 7/2020 |

OTHER PUBLICATIONS

International Search Report and Written Opinion (with English translations) for corresponding PCT Application No. PCT/CN2022/073046, dated Oct. 10, 2022, 19 pages. .

Pingping et al, "Quantum dot lithography technology and its display applications" (with English translation), Chinese Journal of Applied Chemistry, vol. 38 No. 9, Sep. 2021, pp. 1175-1188.

LIGHT-EMITTING SUBSTRATE AND METHOD FOR MANUFACTURING THE SAME, SOLUTION CONTAINING LIGHT-EMITTING MATERIAL AND LIGHT-EMITTING APPARATUS

CROSS-REFERENCE TO RELATED APPLICATION

This application is a national phase entry under 35 USC 371 of International Patent Application No. PCT/CN2022/090584 filed on Apr. 29, 2022, which is incorporated herein by reference in its entirety.

TECHNICAL FIELD

The present disclosure relates to the field of display technologies, and in particular, to a light-emitting substrate and a method for manufacturing the same, a solution containing a light-emitting material and a light-emitting apparatus.

BACKGROUND

Compared with organic light-emitting materials, quantum dots have advantages such as high luminous color purity and adjustable light-emitting wavelength. In addition, the quantum dots have excellent photochemical stability and thermal stability. Therefore, quantum dot light-emitting diodes using the quantum dots as light-emitting materials are widely used in the display field.

SUMMARY

In one aspect, a light-emitting substrate is provided. The light-emitting substrate includes a substrate and a first light-emitting device. The first light-emitting device includes a first electrode, a first functional layer, a first light-emitting pattern and a second electrode that are sequentially disposed in a direction away from the substrate. The first functional layer is in contact with the first light-emitting pattern. The first light-emitting pattern includes a first light-emitting material. The first light-emitting material includes first light-emitting particles and first ligands combined with the first light-emitting particles. The first functional layer includes a first functional material. The first functional material includes first functional particles and second ligands combined with the first functional particles. A development characteristic of the first ligands same as a development characteristic of the second ligands.

In some embodiments, a particle diameter of the first functional particles is less than a particle diameter of the first light-emitting particles.

In some embodiments, the first functional layer further includes third ligands. The third ligands are combined with the first functional particles. A chain length of the third ligands is less than a chain length of the first ligands; or the chain length of the third ligands is less than a chain length of first photosensitive ligands, the first ligands being products of the first photosensitive ligands under irradiation.

Alternatively, the first functional layer further includes the third ligands. The third ligands are combined with the first functional particles. The chain length of the third ligands is less than the chain length of the first ligands, or the chain length of the third ligands is less than the chain length of first photosensitive ligands, the first ligands being products of the first photosensitive ligands under light irradiation. For the first functional particles, a ratio of a number of the second ligands to a sum of the number of the second ligands and a number of the third ligands is in a range of 1/2 to 2/3, inclusive.

In some embodiments, a ratio of a thickness of the first functional layer to a thickness of the first light-emitting pattern is in a range of 1/3 to 1/5, inclusive.

Alternatively, a ratio of a number of the first light-emitting particles in the first light-emitting pattern to a number of the first functional particles in the first functional layer is in a range of 66/100 to 80/100, inclusive.

In some embodiments, both the first ligands and the second ligands are photosensitive ligands. Alternatively, both the first ligands and the second ligands are products of respective photosensitive ligands under light irradiation.

In some embodiments, the light-emitting substrate further includes an auxiliary functional layer. The auxiliary functional layer is located between the first electrode and the first functional layer.

In some embodiments, the light-emitting substrate further includes a second light-emitting device. The second light-emitting device includes a third electrode, a second functional layer, a second light-emitting pattern and a fourth electrode that are sequentially disposed in the direction away from the substrate. The second functional layer is in contact with the second light-emitting pattern. The second light-emitting pattern includes a second light-emitting material. The second light-emitting material includes second light-emitting particles and fourth ligands combined with the second light-emitting particles. The second functional layer includes a second functional material. The second functional material includes second functional particles and fifth ligands combined with the second functional particles. A development characteristic of the fourth ligands is same as a development characteristic of the fifth ligands.

In some embodiments, the second functional layer further includes sixth ligands, the sixth ligands are combined with the second functional particles, and a chain length of the sixth ligands is less than a chain length of the fourth ligands; and/or the first light-emitting device further includes a first material layer, the first material layer is located on a surface of the first light-emitting pattern away from the substrate, and a material of the first material layer is same as the second functional material.

In some embodiments, the light-emitting substrate further includes a third light-emitting device. The third light-emitting device includes a fifth electrode, a third functional layer, a third light-emitting pattern and a sixth electrode that are sequentially disposed in the direction away from the substrate. The third functional layer is in contact with the third light-emitting pattern. The third light-emitting pattern includes a third light-emitting material. The third light-emitting material includes third light-emitting particles and seventh ligands combined with the third light-emitting particles. The third functional layer includes a third functional material. The third functional material includes third functional particles and eighth ligands combined with the third functional particles. A development characteristic of the seventh ligands is same as a development characteristic of the eighth ligands.

In some embodiments, the third functional layer further includes ninth ligands. The ninth ligands are combined with the third functional particles. A chain length of the ninth ligands is less than a chain length of the seventh ligands.

In some embodiments, the light-emitting substrate further includes a second light-emitting device. The second light-emitting device includes a third electrode, a second functional layer, a second light-emitting pattern and a fourth electrode that are sequentially disposed in the direction away from the substrate. The second functional layer is in contact with the second light-emitting pattern. The second light-emitting pattern includes a second light-emitting material. The second light-emitting material includes second light-emitting particles and fourth ligands combined with the second light-emitting particles. The second functional layer includes a second functional material. The second functional material includes second functional particles and fifth ligands combined with the second functional particles. A development characteristic of the fourth ligands is same as a development characteristic of the fifth ligands.

The second light-emitting device further includes a second material layer, the second material layer is located on a surface of a second light-emitting pattern away from the substrate, and a material of the second material layer is same as a material of a third functional layer; and/or a particle diameter of the first light-emitting particles and a particle diameter of second light-emitting particles of the second light-emitting device are both greater than a particle diameter of the third light-emitting particles, the first functional particles and the second functional particles of the second light-emitting device are P-type semiconductors, and the third functional particles are N-type semiconductors.

In another aspect, a solution containing a light-emitting material is provided. The solution containing the light-emitting material includes a first solvent and a first initial light-emitting material and a first initial functional material that are dissolved in the first solvent. The first initial light-emitting material includes first light-emitting particles and first photosensitive ligands combined with the first light-emitting particles. The first initial functional material includes first functional particles and second photosensitive ligands combined with the first functional particles. A photosensitive characteristic of the first photosensitive ligands is same as a photosensitive characteristic of the second photosensitive ligands. A migration rate of the first initial functional material in the first solvent is greater than a migration rate of the first initial light-emitting material in the first solvent.

In some embodiments, a solubility of the first initial functional material in the first solvent is less than a solubility of the first initial light-emitting material in the first solvent; and/or a particle diameter of the first functional particles is less than a particle diameter of the first light-emitting particles.

In some embodiments, the solution containing the light-emitting material further includes third ligands. The third ligands are combined with the first functional particles. A solubility of the third ligands in the first solvent is less than a solubility of the first photosensitive ligands in the first solvent.

Alternatively, the solution containing the light-emitting material further includes the third ligands. The third ligands are combined with the first functional particles. The solubility of the third ligands in the first solvent is less than the solubility of the first photosensitive ligands in the first solvent, and a chain length of the third ligands is less than a chain length of the first photosensitive ligands.

In yet another aspect, a method for manufacturing a light-emitting substrate is provided. The method for manufacturing the light-emitting substrate includes the following steps:

forming a first electrode on a substrate; forming a first functional layer and a first light-emitting pattern on a side of the first electrode away from the substrate, the first light-emitting pattern including a first light-emitting material, the first light-emitting material including first light-emitting particles and first ligands combined with the first light-emitting particles, the first functional layer including a first functional material, the first functional material including first functional particles and second ligands combined with the first functional particles, a development characteristic of the first ligands being same as a development characteristic of the second ligands; and forming a second electrode on a side of the first light-emitting pattern away from the substrate, the first electrode, the first functional layer, the first light-emitting pattern and the second electrode constituting a first light-emitting device.

In some embodiments, forming the first functional layer and the first light-emitting pattern on the side of the first electrode away from the substrate includes: forming a first mixture film, by a coating process of a first mixture solution, on the side of the first electrode away from the substrate to obtain, the first mixture solution including a first solvent and a first initial light-emitting material and a first initial functional material that are dissolved in the first solvent, the first initial light-emitting material including first light-emitting particles and first photosensitive ligands combined with the first light-emitting particles, the first initial functional material including first functional particles and second photosensitive ligands combined with the first functional particles, a photosensitive characteristic of the first photosensitive ligands being same as a photosensitive characteristic of the second photosensitive ligands, a migration rate of the first initial functional material in the first solvent being greater than a migration rate of the first initial light-emitting material in the first solvent; and performing an exposure, by a mask, and a development on the first mixture film to obtain the first functional layer and the first light-emitting pattern.

In some embodiments, performing the exposure, by the mask, and the development on the first mixture film to obtain the first functional layer and the first light-emitting pattern includes: exposing the first mixture film by using the mask, first photosensitive ligands and second photosensitive ligands, located in a first region, of the first mixture film respectively producing first optically variable ligands and second optically variable ligands under light irradiation, the first region being a region where the first light-emitting device is located; and dissolving and removing an portion, located outside the first region, of the first mixture film by using a first developing solution after the exposure to obtain the first functional layer and the first light-emitting pattern, a solubility of the first photosensitive ligands in the first developing solution being greater than a solubility of the first optically variable ligands in the first developing solution, a solubility of the second photosensitive ligands in the first developing solution being greater than a solubility of the second optically variable ligands in the first developing solution.

Alternatively, performing the exposure, by the mask, and the development on the first mixture film to obtain the first functional layer and the first light-emitting pattern includes: exposing the first mixture film by using the mask, first photosensitive ligands and second photosensitive ligands, located outside a first region, respectively producing first optically variable ligands and second optically variable ligands under light irradiation, the first region being a region where the first light-emitting device is located; and dissolving and removing an exposed portion, located outside the first region, of the first mixture film by using a second developing solution, a solubility of the first photosensitive ligands in the second developing solution being less than a solubility of the first optically variable ligands in the second developing solution, and a solubility of the second photosensitive ligands in the second developing solution being less than a solubility of the second optically variable ligands in the second developing solution.

In some embodiments, the method further includes the following steps: forming a third electrode on the substrate; forming a second functional layer and a second light-emitting pattern on a side of the third electrode away from the substrate, a material of the second light-emitting pattern including a second light-emitting material, the second light-emitting material including second light-emitting particles and fourth ligands combined with the second light-emitting particles, a material of the second functional layer including a second functional material, the second functional material including second functional particles and fifth ligands combined with the second functional particles, and a development characteristic of the fourth ligands is same as a development characteristic of the fifth ligands; and forming a fourth electrode on a side of the second light-emitting pattern away from the substrate, the third electrode, the second functional layer, the second light-emitting pattern and the fourth electrode constituting a second light-emitting device.

In some embodiments, the method further includes the following steps: forming a fifth electrode on the substrate; forming a third functional layer and a third light-emitting pattern on a side of the fifth electrode away from the substrate, a material of the third light-emitting pattern being a third light-emitting material, the third light-emitting material including third light-emitting particles and seventh ligands combined with the third light-emitting particles, a material of the third functional layer including a third functional material, the third functional material including third functional particles and eighth ligands combined with the third functional particles, and a development characteristic of the seventh ligands is a development characteristic of the eighth ligands; and forming a sixth electrode on a side of the third light-emitting pattern away from the substrate, the fifth electrode, the third functional layer, the third light-emitting pattern and the sixth electrode constituting a third light-emitting device.

In yet another aspect, a light-emitting apparatus is provided. The light-emitting apparatus includes the light-emitting substrate as described above.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these accompanying drawings. In addition, the accompanying drawings to be described below may be regarded as schematic diagrams, and are not limitations on an actual size of a product, an actual process of a method and an actual timing of a signal involves in the embodiments of the present disclosure.

DETAILED DESCRIPTION

Figure 1:
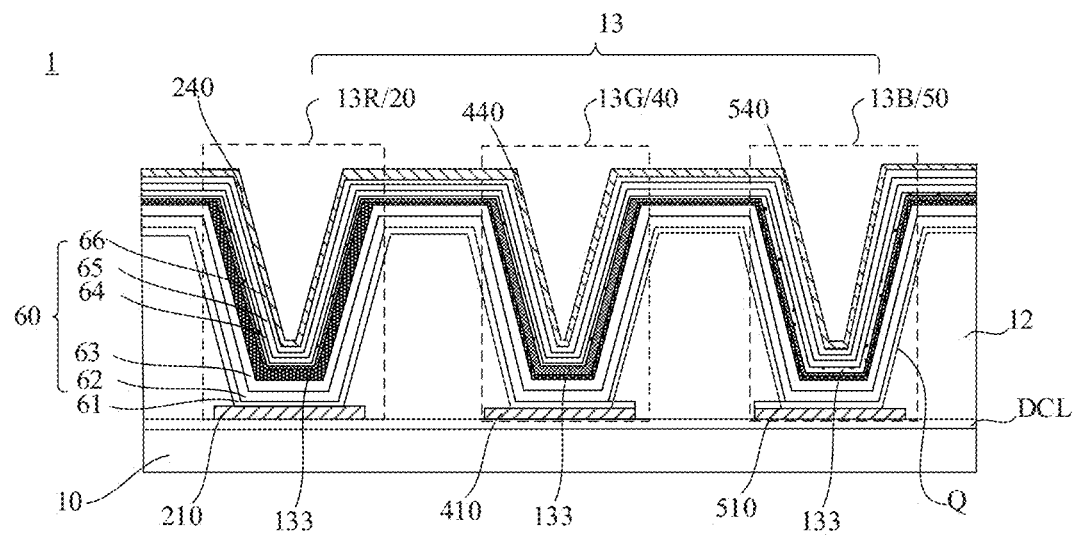
FIG. 1 is a sectional view of a substrate, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms does not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying a relative importance or implicitly indicating a number of indicated technical features. Thus, features defined with "first" or "second" may explicitly or implicitly include one or more of the features. In the description of the embodiments of the present disclosure, unless otherwise specified, the term "a plurality of/the plurality of" means two or more.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when" or "in a case where" or "in response to determining" or "in response to detecting". Similarly, depending on the context, the phrase "if it is determined . . . " or "if [a stated condition or event] is detected" is optionally construed as "in a case where it is determined . . . ", "in response to determining . . . ", "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term "parallel", "perpendicular" or "equal" include a stated case and a case similar to the stated case. A range of the similar case is within an acceptable deviation range of deviation, and the acceptable range of deviation is determined by a person of ordinary skill in the art in view of the measurement in question and errors associated with the measurement of a particular quantity (i.e., limitations of a measurement system). For example, the term "parallel" includes absolute parallelism and approximately parallelism, and an acceptable range of deviation of the approximately parallelism may be, for example, a deviation within 5°. The term "perpendicular" includes absolute perpendicularity and approximately perpendicularity, and an acceptable range of deviation of the approximately perpendicularity may be, for example, a deviation within 5°. The term "equal" includes absolute equality and approximately equal, and an acceptable range of deviation of the approximate equality may refer to, for example, that a difference between two equals is less than or equal to 5% of either of the two equals.

It will be understood that, when a layer or an element is described as being on another layer or a substrate, it may be that the layer or the element is directly on the another layer or the substrate, or that there is an intermediate layer between the layer or the element and the another layer or the substrate.

Exemplary embodiments are described herein with reference to sectional views and/or plan views as idealized exemplary drawings. In the accompanying drawings, thicknesses of layers and regions are enlarged for clarity. Thus, variations in shapes with respect to the accompanying drawings due to, for example, manufacturing technologies and/or tolerances may be envisaged. Therefore, the exemplary embodiments should not be construed as limited to the shapes of the regions illustrated herein, but include deviations in shape due to, for example, manufacturing. For example, an etched region shown as a rectangle generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a light-emitting apparatus. The light-emitting apparatus includes a light-emitting substrate. However, the light-emitting apparatus may further include other components. For example, the light-emitting apparatus may further include a circuit for providing electrical signals to the light-emitting substrate to drive the light-emitting substrate to emit light. The circuit may be referred to as a control circuit. The light-emitting apparatus may further include a circuit board and/or an integrated circuit (IC) electrically connected to the light-emitting substrate.

In some embodiments, the light-emitting apparatus may be a lighting apparatus. In this case, the light-emitting apparatus is used as a light source to implement a lighting function. For example, the light-emitting apparatus may be a backlight module of a liquid crystal display apparatus, a lamp for internal or external illumination, or various signal lamps.

In some other embodiments, the light-emitting apparatus may be a display apparatus. In this case, the light-emitting substrate is a display substrate for displaying an image (i.e., a picture). The light-emitting implement may include a display or a product including the display. The display may be a flat panel display (FPD), a micro display, etc. According to whether a user can see a scene on a back of the display, the display may be classified as a transparent display or an opaque display. According to whether the display can be bent or curled, the display may be a flexible display or a common display (which may be referred to as a rigid display). For example, a product including the display may include a computer display, a television, a billboard, a laser printer having a display function, a telephone, a mobile phone, a personal digital assistant (PDA), a laptop computer, a digital camera, a portable camcorder, a viewfinder, a vehicle, a large wall, a theater screen or a stadium sign.

Figure 2:
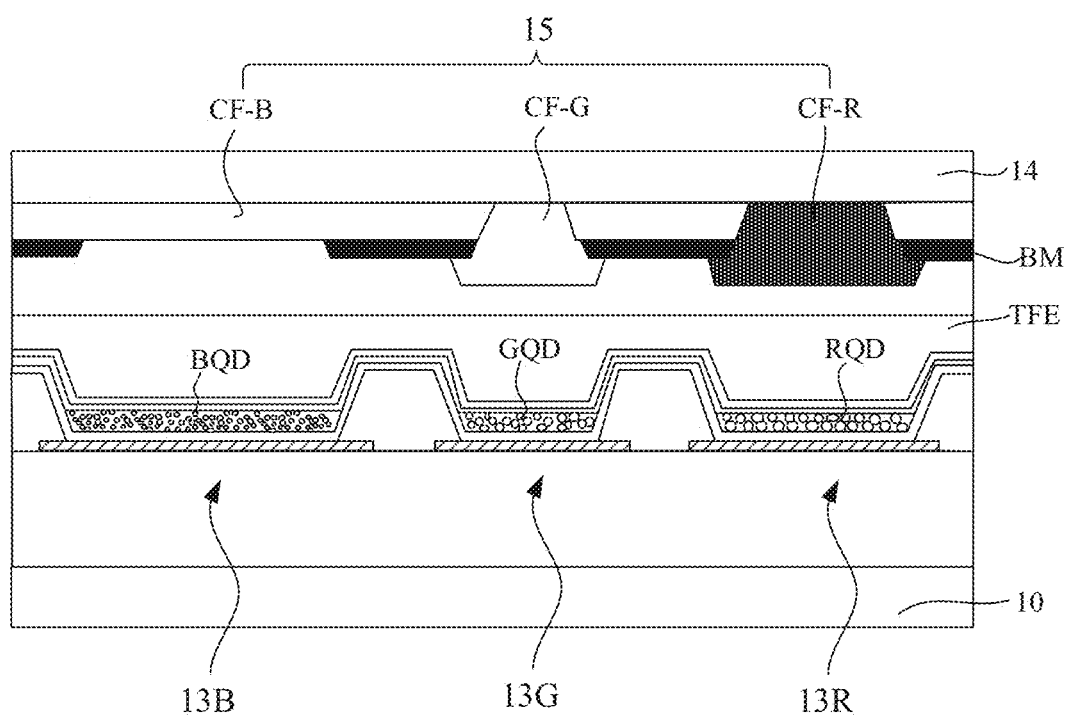
FIG. 2 is a sectional view of another substrate, in accordance with some embodiments.

Some embodiments of the present disclosure provide a light-emitting substrate 1. As shown in FIGS. 1 and 2, the light-emitting substrate 1 includes a substrate 10 and a driving circuit layer DCL, a pixel defining layer 12 and a plurality of light-emitting devices 13 that are disposed on the substrate 10. The pixel defining layer 12 has a plurality of openings Q. The plurality of light-emitting devices 13 may be arranged to correspond the plurality of openings Q in a one-to-one manner. The plurality of light-emitting devices 13 here may be all or a portion of light-emitting devices 13 included in the light-emitting substrate 1, and the plurality of openings Q may be all or a portion of openings in the pixel defining layer 12.

The light-emitting substrate 1 may emit white light, monochromatic light (light of a single color), or color-adjustable light.

In a first example, the light-emitting substrate 1 may emit white light. In a first case of this example, the plurality of light-emitting devices 13 (which, for example, may be all light-emitting devices 13) included in the light-emitting substrate 1 emit white light. In this case, a material of a light-emitting pattern 133 of each light-emitting device 13 may include a mixture material composed of a red light-emitting material, a green light-emitting material and a blue light-emitting material. In this case, it may be possible to emit white light by driving each light-emitting device 13 to emit light. In a second case, as shown in FIGS. 1 and 2, the plurality of light-emitting devices 13 include a light-emitting device 13R for emitting red light, a light-emitting device 13G for emitting green light and a light-emitting device 13B for emitting blue light. A material of a light-emitting pattern 133 of the light-emitting device 13R may include the red light-emitting material, a material of a light-emitting pattern 133 of the light-emitting device 13G may include the green light-emitting material, and a material of a light-emitting pattern 133 of the light-emitting device 13B may include the blue light-emitting material. In this case, by controlling light emission luminance of the light-emitting device 13R, light emission luminance of the light-emitting device 13G and light emission luminance of the light-emitting device 13B, it may be possible to achieve light mixing between the light-emitting device 13R, the light-emitting device 13G and the light-emitting device 13B, so that the light-emitting substrate 1 presents white light.

In this example, the light-emitting substrate 1 may be used for illumination, i.e., applied to a lighting apparatus.

In a second example, the light-emitting substrate 1 may emit monochromatic light. In a first case, the plurality of light-emitting devices 13 (which, for example, may be all light-emitting devices 13) included in the light-emitting substrate 1 each emit monochromatic light (e.g., red light). In this case, a material of a light-emitting pattern 133 in each light-emitting device 13 includes a red light-emitting material. In this case, by driving each light-emitting device 13 to emit light, red light is emitted. In a second case, the light-emitting substrate 1 has a structure similar to that of the plurality of light-emitting devices as described in the second case of the first example. In this case, by individually driving the light-emitting device 13R, the light-emitting device 13G or the light-emitting device 13B, monochromatic light may be emitted.

In this example, the light-emitting substrate 1 may be used for illumination, i.e., applied to a lighting apparatus. The light-emitting substrate 1 may also be used for displaying an image or a picture of a single color, i.e., applied to a display apparatus.

In a third example, the light-emitting substrate 1 may emit color-adjustable light (i.e., multi-colored light). The light-emitting substrate 1 have a structure similar to that of the plurality of light-emitting devices as described in the second case of the first example. By controlling luminance of the light-emitting devices 13, a color and luminance of mixed light emitted by the light-emitting substrate 1 may be controlled, so that multi-colored light may be emitted.

In this example, the light-emitting substrate may be used for displaying an image or a picture, i.e., applied to a display apparatus. Of course, the light-emitting substrate may also be used in a lighting apparatus.

Figure 3:
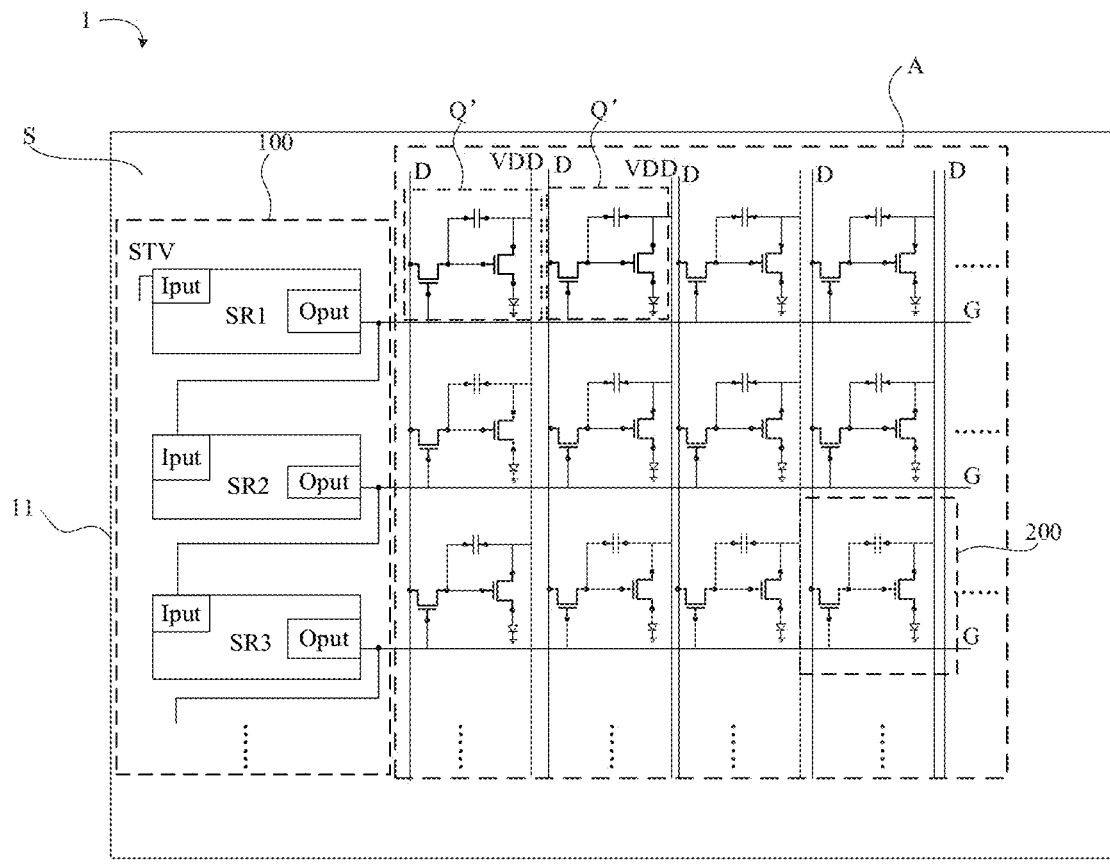
FIG. 3 is a top view of a substrate, in accordance with some embodiments.

In the third example, considering an example where the light-emitting substrate 1 is a display substrate, e.g., a full-color display panel, as shown in FIG. 3, the light-emitting substrate 1 includes a display region A and a peripheral region S disposed on a periphery of the display region A. The display region A includes a plurality of sub-pixel regions Q'. Each sub-pixel region Q' corresponds to a single opening Q. A single opening Q corresponds to a single light-emitting device. Each sub-pixel region Q' is provided therein with a pixel driving circuit 200 for driving a respective light-emitting device to emit light. The peripheral region S is used for wiring such as a gate driving circuit 100 connected to pixel driving circuits 200.

In some embodiments, the pixel driving circuit 200 may include thin film transistor(s) and capacitor(s). For example, the pixel driving circuit 200 may have a 2T1C structure.

Figure 4:
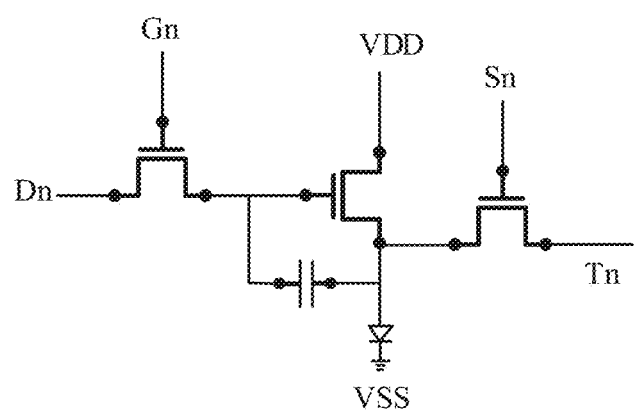
FIG. 4 is an equivalent circuit diagram of a pixel driving circuit with a 3T1C structure, in accordance with some embodiments.

Of course, in some embodiments, the pixel driving circuit 200 may also have a 7T1C structure or a 3T1C structure. As shown in FIG. 4, the pixel driving circuit 200 having a 3T1C structure is shown as a specific example.

In addition, it will be noted that, in order to realize white balance of the full-color display panel, as for sub-pixel regions for emitting light of different colors, an area of an sub-pixel region Q' for emitting red light and an area of a sub-pixel region Q' for emitting green light are greater than an area of a sub-pixel region Q' for emitting blue light. Further, the area of the sub-pixel region Q' for emitting red light may be equal to the area of the sub-pixel region Q' for emitting green light, or the area of the sub-pixel region Q' for emitting red light may be greater or less than the area of the sub-pixel region Q' for emitting green light.

In some embodiments, as shown in FIG. 2, in addition to the display substrate, the display apparatus may further include an encapsulation layer 14 and a light control layer 15 that are disposed on the display substrate. The encapsulation layer 14 is used for protecting the light-emitting devices 13. The light control layer 15 may control reflected light from the display substrate by means of external light. For example, the light control layer 15 may include a polarizer and/or a color filter layer (e.g., a color film (CF) layer).

A light-emitting material of the light-emitting device may be a quantum dot light-emitting material. In this case, the light-emitting device may be referred to as a quantum dot light-emitting diode (QLED) correspondingly. QLEDs are also used in the field of display. Technologies for forming the light-emitting pattern of the light-emitting device mainly include an inkjet printing technology, a photolithography technology, a transfer technology, etc. The photolithography technology is the most promising method for forming QLEDs with high resolution.

The photolithography technology refers to a technology of patterning the quantum dot light-emitting material by exposure and development. Here, there are two possible cases.

In a first case, the quantum dot light-emitting material is patterned by a direct photolithography method. It will be noted that, the quantum dot light-emitting material is a light-emitting material included in the light-emitting substrate, while a raw material for preparing the quantum dot light-emitting material may be referred to as a quantum dot initial light-emitting material. The quantum dot initial light-emitting material includes quantum dots and photosensitive ligands combined with the quantum dots. The photosensitive ligands are ligands capable of undergoing a decomposition reaction or a crosslinking reaction under light irradiation.

After the quantum dot initial light-emitting material forms a film, exposure may be performed by using a mask. Some region(s) of the film are exposed, and remaining region(s) are not exposed. In the exposed region(s) of the film, photosensitive ligands undergo a reaction under light irradiation to produce another kind of ligands (which may be referred to as optically variable ligands in order to be distinguished from the photosensitive ligands). A solubility of the optically variable ligands and a solubility of the photosensitive ligands in a same developing solution are different from each other. A solubility of a material containing quantum dots is mainly determined by a solubility of ligands. That is, the higher the solubility of the ligands in a developing solution is, the higher the solubility of the material containing the quantum dots in the developing solution is correspondingly. Therefore, a solubility of the exposed region(s) of the film and a solubility of the non-exposed region(s) of the film in a same developing solution are different from each other. Thus, in a subsequent developing step, the exposed region(s) or the non-exposed region(s) of the film are removed by using the developing solution to obtain a patterned quantum dot light-emitting material.

In a second case, the quantum dot light-emitting material is patterned by using a sacrificial layer. For example, before the quantum dot light-emitting material is formed, the sacrificial layer is firstly formed in a region where the quantum dot initial light-emitting material needs to be removed, and then the quantum dot light-emitting material is patterned by eluting the sacrificial layer.

The patterning methods are convenient for controlling technological processes, and may effectively realize production of a QLED product with high resolution. However, for the first case, the patterning method has a problem of incomplete elution of a quantum dot light-emitting material (e.g., a red quantum dot (RQD) light-emitting material) in a previous layer, so that a quantum dot light-emitting material of another color (e.g., a green quantum dot (GQD) light-emitting material) in a next layer contains residue of the light-emitting material in the previous layer, which causes a problem of color mixing. Consequently, during lighting, it is prone to a problem of impure luminescence spectrum, which affects performance of the device. For the second case, the patterning method may avoid the residue of the quantum dot light-emitting material. However, in a elution step, the quantum dot light-emitting material is continuously eluted, which causes loss of the quantum dot light-emitting material and is adverse to increasing a utilization rate of the quantum dot light-emitting material.

In view of this, a light-emitting substrate, which may realize patterning of a quantum dot light-emitting material by using a direct photolithography method and has little residue of the quantum dot light-emitting material and a pure luminescence spectrum, is provided.

Figure 5:
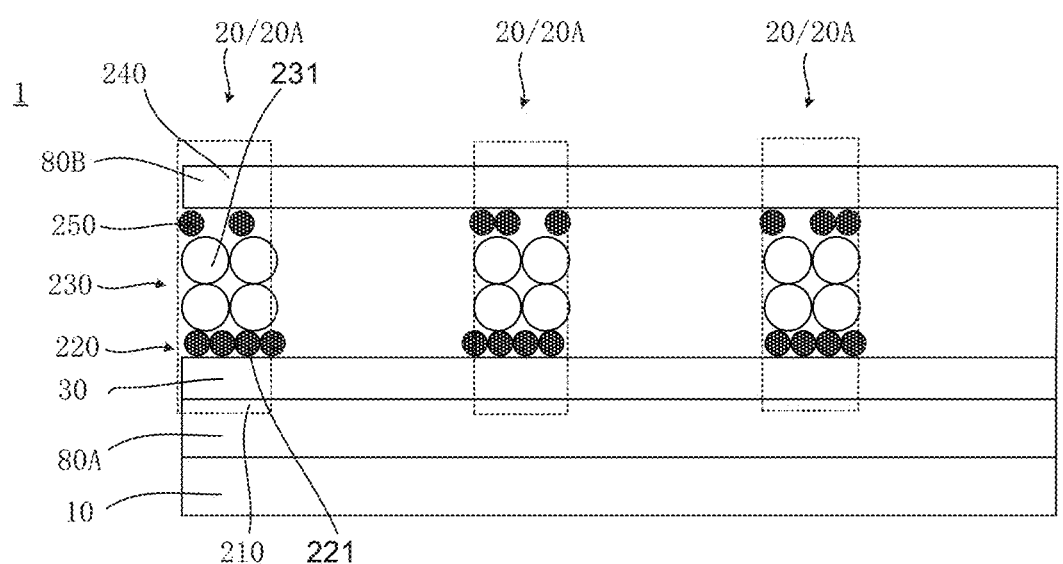
FIG. 5 is a sectional view of yet another substrate, in accordance with some embodiments.

In some embodiments, with reference to FIG. 5, a light-emitting substrate 1 is provided. The light-emitting substrate 1 includes a substrate 10 and first light-emitting device(s) 20.

The substrate 10 may be made of an inorganic material, an organic material, a silicon wafer, a composite material layer, etc. The inorganic material may be, for example, glass or metal. The organic material may be, for example, polycarbonate, polymethyl methacrylate, polyethylene terephthalate, polyethylene naphthalate, polyamide or polyethersulfone or a combination thereof.

The first light-emitting device(s) 20 are a portion of the plurality of light-emitting devices as described above. For example, the first light-emitting device(s) 20 are one or more of the plurality of light-emitting devices. That is, there is at least one first light-emitting device 20 (e.g., a plurality of light-emitting devices 20). The first light-emitting device 20 may be a red light-emitting device, a green light-emitting device or a blue light-emitting device.

The first light-emitting device 20 includes a first electrode 210, a first functional layer 220, a first light-emitting pattern 230 and a second electrode 240 that are sequentially disposed in a direction away from the substrate 10.

For ease of description, a layer in which the first electrode 210 is located may be referred to as a first electrode pattern layer 80A. A layer in which the second electrode 240 is located may be referred to as a second electrode pattern layer 80B. The first electrode 210 and the second electrode 240 may be transmissive electrodes, partially-transmissive and partially-reflective electrodes or reflective electrodes. A material of a transmissive electrode or a material of a partially-transmissive and partially-reflective electrode may include a conductive oxide such as zinc oxide, indium oxide, tin oxide, indium tin oxide (ITO), indium zinc oxide (IZO) or fluorine-doped tin oxide, or a thin metal layer. A reflective electrode may include a reflective metal, for example, an opaque conductor such as aluminum (Al), silver (Ag) or gold (Au). The first electrode 210 and the second electrode 240 may have a single-layer structure or a multi-layer structure. The first electrode 210 and/or the second electrode 240 may be connected with an auxiliary electrode. In a case where the second electrode 240 is connected to the auxiliary electrode, a resistance of the second electrode 240 may be reduced.

A type of the first electrode 210 and a type of the second electrode 240 may be determined depending on a light-exit mode of the light-emitting substrate 1. For example, according to the light-emitting mode, the light-emitting substrate 1 may be classified as a top-emission type light-emitting substrate, a bottom-emission type light-emitting substrate or a double-sided emission type light-emitting substrate.

For example, in a case where the light-emitting substrate 1 is a top-emission type light-emitting substrate, the second electrode 240 may be a transmissive electrode, and the first electrode 210 may be a reflective electrode.

For another example, in a case where the light-emitting substrate 1 is a bottom-emission type light-emitting substrate, the first electrode 210 is a transmissive electrode, and the second electrode 240 is a reflective electrode.

For yet another example, in a case where the light-emitting substrate 1 is a double-sided emission type light-emitting substrate, the first electrode 210 and the second electrode 240 are both transmissive electrodes.

One of the first electrode 210 and the second electrode 240 is an anode, and the other of the first electrode 210 and the second electrode 240 is a cathode. In some embodiments, the first electrode 210 may be an anode; and in this case, the second electrode 240 may be a cathode. In some other embodiments, the first electrode 210 may be a cathode; and in this case, the second electrode 240 may be an anode.

In some embodiments, the anode may include a conductor having a high work function, such as a metal or a conductive metal oxide or a combination thereof. The metal may be nickel, platinum, vanadium, chromium, copper, zinc or gold or an alloy thereof. The conductive metal oxide may be zinc oxide, indium oxide, tin oxide, indium tin oxide (ITO), indium zinc oxide (IZO) or fluorine-doped tin oxide. The combination of the metal and the conductive metal oxide may be a combination of Al and ZnO, a combination of Sb and $SnO_2$, or a combination of ITO, Ag and ITO (ITO/Ag/ITO), which is not limited thereto.

The cathode may include a conductor having a lower work function than the anode, such as a metal, a conductive metal oxide and/or a conductive polymer. For example, the metal may be aluminum, magnesium, calcium, sodium, potassium, titanium, indium, yttrium, lithium, gadolinium, silver, tin, lead, cesium or barium or an alloy thereof. For example, a multi-layer structure may be LiF and Al (LIF/Al), $Li_2O$ and Al ($Li_2O$/Al), Liq and Al (Liq/Al), LiF and Ca (LIF/Ca), or $BaF_2$ and Ca ($BaF_2$/Ca). The conductive metal oxide may be zinc oxide, indium oxide, tin oxide, indium tin oxide (ITO), indium zinc oxide (IZO) or fluorine-doped tin oxide, which is not limited thereto.

The work function of the anode may be higher than the work function of the cathode. For example, the work function of the anode may be in a range of about 4.5 eV to about 5.0 eV, inclusive; and the work function of the cathode may be in a range of about 4.0 eV to about 4.7 eV, inclusive. Within such ranges, the work function of the anode may be, for example, in a range of about 4.6 eV to about 4.9 eV, inclusive, or in a range of about 4.6 eV to about 4.8 eV, inclusive; and the work function of the cathode may be, for example, in a range of about 4.0 eV to about 4.6 eV, inclusive, or in a range of about 4.3 eV to about 4.6 eV, inclusive.

Similarly, a polarity of the first electrode 210 and a polarity of the second electrode 240 may be determined depending on a type of the light-emitting substrate 1. The first light-emitting device 20 may be an "upright" type light-emitting device or an "inverted" type light-emitting device.

In a case where the first light-emitting device 20 is an "upright" type light-emitting device, the first electrode 210 is an anode, and the second electrode 240 is a cathode. In a case where the light-emitting device is an "inverted" type light-emitting device, the first electrode 210 is a cathode, and the second electrode 240 is an anode.

A light emitting principle of the first light-emitting device 20 is as follows. Through a circuit connected to the anode and the cathode, holes are injected into the first light-emitting pattern 230 by using the anode, electrons are injected into the first light-emitting pattern 230 by using the cathode, the electrons and the holes form excitons in the first light-emitting pattern 230, and the excitons transition back to a ground state by radiation, so that photons are emitted.

The first light-emitting pattern 230 includes a first light-emitting material. In addition to the first light-emitting material, the first light-emitting pattern 230 further includes a small amount of first functional material mixed in the first light-emitting material. The first light-emitting pattern 230 is mainly composed of the first light-emitting material. In all components of the first light-emitting pattern 230, the first light-emitting material accounts for 90% or more. The first light-emitting material includes first light-emitting particles 231 (with reference to FIG. 5) and first ligands combined with the first light-emitting particles 231.

The first light-emitting particles 231 may be quantum dots. The quantum dots may be semiconductor nanocrystals. For example, the quantum dots may be nanoparticles, nanotubes, nanowires, nanofibers, nanoplate particles, quantum rods or quantum sheets which have a variety of shapes such as a sphere, a taper, a multi-armed shape and/or a cubic. Here, the quantum rods may be quantum dots having an aspect ratio (a length-to-diameter ratio) (a length-to-width ratio) greater than about 1. For example, the aspect ratio is greater than or equal to about 2, greater than or equal to about 3, or greater than or equal to about 5. For example, the quantum rods may have an aspect ratio of less than or equal to about 50, less than or equal to about 30, or less than or equal to about 20.

The quantum dot may have a core-shell structure. For example, the quantum dot has a quantum dot core and a quantum dot shell surrounding the quantum dot core. The quantum dot may also have a structure of only the quantum dot core.

A material of the quantum dot core may be a Group II-VI semiconductor compound, a Group III-V semiconductor compound, a Group IV-VI semiconductor compound, a Group IV semiconductor, a Group I-III-VI semiconductor compound, a Group I-II-IV-VI semiconductor compound or a Group II-IV semiconductor compound or a combination thereof. The Group II-VI semiconductor compound may be selected from, for example, binary compounds such as CdSe, CdTe, ZnS, ZnSe, ZnTe, ZnO, HgS, HgSe, HgTe, MgSe or MgS or mixtures thereof, ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS or mixtures thereof, and quaternary compounds such as HgZnTeS, CdZnSeS, CdZnSeTe, CdZnSTe, CdHgSeS, CdHgSeTe, CdHgSTe, HgZnSeS, HgZnSeTe or HgZnSTe or mixtures thereof, which is not limited thereto. The Group III-V semiconductor compounds may be selected from, for example, binary compounds such as GaN, GaP, GaAs, GaSb, AlN, AlP, AlAs, AlSb, InN, InP, InAs or InSb or mixtures thereof, ternary compounds such as GaNP, GaNAs, GaNSb, GaPAs, GaPSb, AlNP, AlNAs, AlNSb, AlPAs, AlPSb, InNP, InNAs, InNSb, InPAs or InPSb or mixtures thereof, and quaternary compounds such as GaAlNP, GaAlNAs, GaAlNSb, GaAlPAs, GaAlPSb, GaInNP, GaInNAs, GaInNSb, GaInPAs, GaInPSb, InAlNP, InAlAs, InAlNSb, InAlPAs or InAlPSb or mixtures thereof, which is not limited thereto. The Group IV-VI semiconductor compounds may be selected from, for example, binary compounds such as SnS, SnSe, SnTe, PbS, PbSe or PbTe or mixtures thereof, ternary compounds such as SnSeS, SnSeTe, SnSTe, PbSeS. PbSeTe, PbSTe, SnPbS, SnPbSe or SnPbTe or mixtures thereof, and quaternary compounds such as SnPbSSe, SnPbSeTe or SnPbSTe or mixtures thereof, which is not limited thereto. The Group IV semiconductor may be selected from, for example, elemental (unary) semiconductors such as Si or Ge or mixtures thereof, and binary semiconductor compounds such as SiC or SiGe or mixtures thereof, which is not limited thereto. The Group I-III-VI semiconductor compound may be, for example, $CuInSe_2$, $CuInS_2$, CuInGaSe or CuInGaS or a mixture thereof, which is not limited thereto. The Group I-II-IV-VI semiconductor compound may be, for example, CuZnSnSe or CuZnSnS or a mixture thereof, which is not limited thereto. The Group II-III-V semiconductor compound may include, for example, InZnP, which is not limited thereto.

The quantum dot shell is a compound having a composition different from that of the quantum dot core and including zinc (Zn), selenium (Se) and/or sulfur(S). For example, the quantum dot shell may include one or more of ZnSeS, ZnSe and ZnS.

The quantum dots may have a particle diameter (an average of maximum particle lengths for quantum dots having a non-spherical shape), for example, in a range of about 1 nm to about 100 nm, inclusive, in a range of about 1 nm to about 80 nm, inclusive, in a range of about 1 nm to about 50 nm, inclusive, or in a range of about 1 nm to 20 nm, inclusive. It will be noted that, whether the quantum dot has the core-shell structure or the structure of the quantum dot core without the quantum dot shell, a color of light emitted by the quantum dot is determined by the quantum dot core. Therefore, the particle diameter or size of the quantum dot refers to a particle diameter or size of the quantum dot core. In addition, it will be noted that, since particle diameters or sizes of the quantum dots may be different from each other, a particle diameter or a particle size of the quantum dots refers to an average of particle diameters or particle sizes of the quantum dots. Similarly, a particle diameter of light-emitting particles (e.g., the first light-emitting particles, second light-emitting particles, and third light-emitting particles) and a particle diameter of functional particles (e.g., the first functional particles, second functional particles and third functional particles) hereinafter all refer to averages of particle diameters of respective particles. An energy band gap of the quantum dot may be controlled according to the size and a composition of the quantum dot, so that a light-emitting wavelength of the quantum dot may be controlled. For example, when the size of the quantum dot increases, the energy band gap of the quantum dot may be narrowed, and thus the quantum dot is configured to emit light in a relatively long wavelength range; while the size of the quantum dot decreases, the energy band gap of the quantum dot may be widened, and thus the quantum dot is configured to emit light in a relatively short wavelength range. For example, the quantum dot may be configured to emit light in a predetermined wavelength range of a visible light range depending on the size and/or the composition thereof. For example, the quantum dot may be configured to emit blue light, red light or green light. The blue light may have a peak emission wavelength ($\lambda_{max}$), for example, in a range of about 430 nm to about 480 nm, inclusive. The red light may have a peak emission wavelength ($\lambda_{max}$), for example, in a range of about 600 nm to about 650 nm, inclusive. The green light may have a peak emission wavelength ($\lambda_{max}$), for example, in a range of about 520 nm to about 560 nm, inclusive.

For example, an average of particle diameters of quantum dots configured to emit blue light may be less than or equal to about 4.5 nm. For example, the average of the particle diameters of the quantum dots may be in a range of about 2.0 nm to about 4.5 nm, inclusive. For another example, the average of the particle diameters of the quantum dots may be in a range of about 2.0 nm to about 4.3 nm, inclusive. For yet another example, the average of the particle diameters of the quantum dots may be in a range of about 2.0 nm to about 4.0 nm, inclusive.

For example, an average of particle diameters of quantum dots configured to emit green light is in a range of 3 nm to 5 nm, inclusive. For example, the average of the particle diameters of the quantum dots may be in a range of about 3.0 nm to about 4.0 nm, inclusive. For another example, the average of the particle diameters of the quantum dots may be in a range of about 3.0 nm to about 4.4 nm, inclusive. For yet another example, the average of the particle diameters of the quantum dots may be in a range of about 3.8 nm to about 5.0 nm, inclusive.

For example, an average of particle diameters of quantum dots configured to emit green light is in a range of 3.5 nm to 5.5 nm, inclusive. For example, the average of the particle diameters of the quantum dots may be in a range of about 3.5 nm to about 4.6 nm, inclusive. For another example, the average of the particle diameters of the quantum dots may be in a range of about 3.7 nm to about 5.0 nm, inclusive. For yet another example, the average of the particle diameters of the quantum dots may be in a range of about 4.1 nm to about 5.5 nm, inclusive.

The first ligands are generally organic ligands. The organic ligands may be stably combined on surfaces of the first light-emitting particles 231 by means of bifunctional molecular coupling, hydrophobic interaction, silanization, electrostatic interaction or polymer microsphere coating. The organic ligands have large dipole moments, and may transmit energy of excitons to the first light-emitting particles 231, thereby enhancing fluorescence intensity of the first light-emitting particles 231. In addition, a presence of the organic ligands may stabilize the first light-emitting particles 231 to prevent the first light-emitting particles 231 from agglomerating, which allows the first light-emitting particles 231 to be dispersed uniformly.

A solvent used in a solution containing the first light-emitting material is generally an organic solvent (which is usually insoluble in water and may also be referred to as an oily solvent). According to the principle of like dissolves like, the first light-emitting particles 231 are poorly soluble in the organic solvent. Therefore, a solubility of the first light-emitting material in the organic solvent depends on a solubility of the first ligands combined with the first light-emitting particles 231 in the organic solvent.

The first functional layer 220 of the light-emitting substrate 1 may further improve light-emitting efficiency of the first light-emitting device 20.

The first functional layer 220 may be one of carrier auxiliary layers. The carrier auxiliary layers include at least one of an electron injection layer (EIL), an electron transport layer (ETL), a hole blocking layer (HBL), a hole injection layer (HIL), a hole transport layer (HTL) and an electron blocking layer (EBL).

The first functional layer 220 is located between the first electrode 210 and the first light-emitting pattern 230. There may be no other film layer between the first functional layer 220 and the first electrode 210, so that the first functional layer 220 is in contact with the first electrode 210. There may also be one or several other film layers (e.g., an auxiliary functional layer 30 and a layer of the carrier auxiliary layers other than the auxiliary functional layer 30 and the first functional layer 220) between the first functional layer 220 and the first electrode 210. In this case, the first electrode 210 is in contact with some other film layer (e.g., the auxiliary functional layer 30).

The first functional layer 220 is in contact with the first light-emitting pattern 230. The first functional layer 220 may have a function of increasing a transmission rate of holes and reducing a transmission rate of electrons, or a function of reducing the transmission rate of holes and increasing the transmission rate of electrons. In this way, depending on a difference between a transmission rate of holes and a transmission rate of the electrons in the first light-emitting device 20, the first functional layer 220 may be provided to reduce the difference, so that the transmission rate of the holes and the transmission rate of the electrons are balanced. Therefore, a number of excitons formed in the first light-emitting pattern 230 is increased, which improves the light-emitting efficiency of the first light-emitting device 20.

The first functional layer 220 includes the first functional material. In addition to the first functional material, the first functional layer 220 further includes a small amount of first light-emitting material mixed in the first functional material. The first functional layer 220 is mainly composed of the first functional material. In all constituent substances in the first functional layer 220, for example, the first light-emitting material accounts to less than 5% (in this case, a color mixing phenomenon does not occur in the light-emitting substrate 1), and the other constituent substances are all the first functional material. The first functional material includes first functional particles 221 (with reference to FIG. 5) and second ligands combined with the first functional particles 221. The first functional particles 221 are particles which have a particle diameter similar to that of the quantum dots and have no luminescent properties. The first functional particles 221 may have no shell structure. When a fluorescence quantum yield test is performed on the first functional particles 221, the first functional particles 221 show no emission spectrum, i.e., no emission peak. The particle diameter of the first functional particles 221 may be equal to, less or greater than a particle diameter of quantum dots (for example, with reference to the description below, first functional particles 221 having a particle diameter less than the particle diameter of the quantum dots may be selected). The first functional particles 221 are of a nano material, whose sizes, i.e., a length, a width and a height, in three dimensions are all on the order of nanometers.

In some embodiments, the first functional particles 221 are N-type semiconductors, P-type semiconductors or insulators.

The P-type semiconductors may be P-type semiconductor oxides. The P-type semiconductor oxides are a type of metal oxides which conduct charges by using holes as carriers. For this type of metal oxides, a ratio of a number of metal atoms to a number of oxygen atoms does not strictly follow an atomic number ratio in a chemical formula, but the number of the oxygen atoms is slightly greater; and structural defects existing in the oxide are metal ion vacancies. The P-type semiconductor oxides may be $NiO_x$, $MoO_x$, $WO_x$, $VO_x$, $CrO_x$ or other oxides.

The P-type semiconductors may also be P-type semiconductor non-oxides, such as CuI, SnS or CuSCN.

The P-type semiconductors use holes as carriers to conduct charges. Therefore, on one hand, the P-type semiconductors may promote hole transmission and injection; and on the other hand, the P-type semiconductors have weak ability to transmit electrons, and thus transit electrons at a low rate. Therefore, in a case where the first functional particles 221 are P-type semiconductors, the first functional layer 220 may not only promote hole transmission and injection, but also reduce a transmission rate of electrons.

For example, the first light-emitting device 20 is an "upright" type light-emitting device, the first electrode 210 is an anode, and the second electrode 240 is a cathode. In a case where a transmission rate of electrons in the first light-emitting device 20 is greater than a transmission rate of holes in the first light-emitting device 20 (for example, an electron transport layer is further provided between the second electrode 240 and the first light-emitting pattern 230, and a material of the electron transport layer is ZnO), a P-type semiconductor may be selected as a material of the first functional particles 221 of the first functional layer 220. Since the first functional layer 220 is disposed between the first electrode 210 and the first light-emitting pattern 230, and the first functional layer 220 may promote hole transmission and injection, so that the transmission rate of holes in the first light-emitting device 20 is increased. In this way, the difference between the transmission rate of electrons and the transmission rate of holes is reduced, and the transmission rate of holes and the transmission rate of electrons are balanced, which increases the number of excitons formed in the first light-emitting pattern 230 and thereby improves the light-emitting efficiency of the first light-emitting device 20.

For another example, the first light-emitting device 20 is an "inverted" type light-emitting device, the first electrode 210 is a cathode, and the second electrode 240 is an anode. In the case where the transmission rate of electrons 20 in the first light-emitting device is greater than the transmission rate of holes in the first light-emitting device (for example, an electron transport layer is further provided between the first electrode 210 and the first light-emitting pattern 230, and a material of the electron transport layer is ZnO), a P-type semiconductor may be selected as the material of the first functional particles 221 of the first functional layer 220. Since the first functional layer 220 is disposed between the electron transport layer and the first light-emitting pattern 230, and the first functional layer 220 conducts electrons at a low rate, the transmission rate of electrons in the first light-emitting device 20 is reduced. In this way, the difference between the transmission rate of electrons and the transmission rate of holes is reduced, and the transmission rate of holes and the transmission rate of electrons are balanced, which increases the number of excitons formed in the first light-emitting pattern 230 and thereby improves the light-emitting efficiency of the first light-emitting device 20.

The N-type semiconductors may be N-type semiconductor oxides. The N-type semiconductor oxides are a type of metal oxides that conduct charges by using electrons as carriers. For this type of oxides, a ratio of a number of metal atoms to a number of oxygen atoms does not strictly follow that in a chemical formula, but the number of the metal atoms is slightly greater. The N-type semiconductor oxides may be ZnMgO, $TiO_2$, $SnO_2$, CdO, etc.

The N-type semiconductors may also be N-type semiconductor non-oxides, such as CsS, $ZnF_2$ or $Cs_2Se$.

The N-type semiconductors use electrons as carriers to conduct charges. Therefore, on one hand, the N-type semiconductors may promote electron transmission and injection; and on the other hand, the N-type semiconductors have weak ability to transport holes, and thus transmit holes at a low rate. Therefore, in a case where the first functional particles 221 are N-type semiconductors, the first functional layer 220 may not only promote electron transmission and injection, but also reduce the transmission rate of holes.

For example, the first light-emitting device 20 is an "upright" type light-emitting device, the first electrode 210 is an anode, and the second electrode 240 is a cathode. In a case where the transmission rate of holes is greater than the transmission rate of electrons in the first light-emitting device 20 (for example, a hole transport layer is further provided between the second electrode 240 and the first light-emitting pattern 230, and a material of the hole transport layer is $NiO_x$), an N-type semiconductor may be selected as the material of the first functional particles 221 of the first functional layer 220. Since the first functional layer 220 is disposed between the hole transport layer and the first light-emitting pattern 230, and the first functional layer 220 transmits holes at a low rate, the transmission rate of holes in the first light-emitting device 20 is reduced. In this way, the difference between the transmission rate of electrons and the transmission rate of holes is reduced, and the transmission rate of holes and the transmission rate of electrons are balanced, which increases the number of excitons formed in the first light-emitting pattern 230 and thereby improves the light-emitting efficiency of the first light-emitting device 20.

For another example, the first light-emitting device 20 is an "inverted" type light-emitting device, the first electrode 210 is a cathode, and the second electrode 240 is an anode. In the case where the transmission rate of holes is greater than the transmission rate of electrons in the first light-emitting device 20 (for example, a hole transport layer is further provided between the first electrode 210 and the first light-emitting pattern 230, and a material of the hole transport layer is $NiO_x$), an N-type semiconductor is selected as the material of the first functional particles 221 of the first functional layer 220. Since the first functional layer 220 is disposed between the first electrode 210 and the first light-emitting pattern 230, and the first functional layer 220 may provide a portion of electrons, the transmission rate of electrons in the first light-emitting device 20 is improved. In this way, the difference between the transmission rate of electrons and the transmission rate of holes is reduced, and the transmission rate of holes and the transmission rate of electrons are balanced, which increases the number of excitons formed in the first light-emitting pattern 230 and thereby improves the light-emitting efficiency of the first light-emitting device 20.

In some embodiments, the insulators are objects that are not readily conduct electricity. The insulators may be $SiO_2$, $ZrO_2$, $HfO_2$ or $MgO$.

The insulators are not liable to transmit electrons or holes. Therefore, in a case where the first functional particles 221 are insulators, the first functional layer 220 may block holes and electrons.

For example, the first light-emitting device 20 is an "upright" type light-emitting device, the first electrode 210 is an anode, and the second electrode 240 is a cathode. In the case where the transmission rate of holes in the first light-emitting device 20 is greater than the transmission rate of electrons in the first light-emitting device 20 (for example, a hole transport layer is provided between the first electrode 210 and the first light-emitting pattern 230, and a material of the hole transport layer is $NiO_x$), an insulator is selected as the material of the first functional particles 221 of the first functional layer 220. Since the first functional layer 220 is disposed between the hole transport layer and the first light-emitting pattern 230, and the first functional layer 220 may prevent transmission of holes, the transmission rate of holes in the first light-emitting device 20 is reduced. In this way, the difference between the transmission rate of electrons and the transmission rate of holes is reduced, and the transmission rate of holes and the transmission rate of electrons are balanced, which increases the number of excitons formed in the first light-emitting pattern 230 and thereby improves the light-emitting efficiency of the first light-emitting device 20.

For another example, the first light-emitting device 20 is an "inverted" type light-emitting device, the first electrode 210 is a cathode, and the second electrode 240 is an anode. In the case where the transmission rate of electrons in the first light-emitting device 20 is greater than the transmission rate of holes in the first light-emitting device 20 (for example, an electron transport layer is provided between the first electrode 210 and the first light-emitting pattern 230, and a material of the electron transport layer is ZnO), an insulator is selected as the material of the first functional particles 221 of the first functional layer 220. Since the first functional layer 220 is disposed between the electron transport layer and the first light-emitting pattern 230, and the first functional layer 220 may prevent transmission of electrons, the transmission rate of electrons in the first light-emitting device 20 is reduced. In this way, the difference between the transmission rate of electrons and the transmission rate of holes is reduced, and the transmission rate of holes and the transmission rate of electrons are balanced, which increases the number of excitons formed in the first light-emitting pattern 230, and thereby improves the light-emitting efficiency of the first light-emitting device 20.

In a case where the first light-emitting device 20 is an "inverted" type light-emitting device, and the first light-emitting device 20 is a light-emitting device for emitting red light or a light-emitting device for emitting green light, the first light-emitting device 20 may be a many-electron device in which a transmission rate of electrons is greater than a transmission rate of holes. In this case, the material of the first functional particles 221 of the first functional layer 220 may preferentially consider a P-type semiconductor.

Similarly, in a case where the first light-emitting device 20 is an "inverted" type light-emitting device, and the first light-emitting device 20 is a light-emitting device for emitting blue light, the first light-emitting device 20 may be a many-hole device in which a transmission rate of holes is greater than a transmission rate of electrons. In this case, the material of the first functional particles 221 of the first functional layer 220 may preferentially consider an N-type semiconductor.

The second ligands may be organic ligands. For a manner in which the second ligands are combined with the first functional particles 221, reference may be made to a manner in which the first ligands are combined with the first light-emitting particles 231, which will not be repeated here. A presence of the organic ligands may stabilize the first functional particles 221 to prevent the first functional particles 221 from agglomerating, which allows the first functional particles 221 to be dispersed uniformly. Correspondingly, a solubility of the first functional material is mainly determined by the second ligands.

The first ligands may be first photosensitive ligands or first optically variable ligands (i.e., products of the first photosensitive ligands under light irradiation), and an exact type of the first ligands is determined depending on a method by which the first light-emitting pattern 230 is formed. Similarly, whether the second ligands are second photosensitive ligands or second optically variable ligands (i.e., products of the second photosensitive ligands under light irradiation), and an exact type of the second ligands is determined depending on a method by which the first functional layer 220 is formed.

Detailed description is given in conjunction with the methods for forming the first light-emitting pattern 230 and the first functional layer 220 below.

With reference to FIG. 5, the first light-emitting pattern 230 and the first functional layer 220 may be formed by performing an exposure and a development on a first mixture film formed by a first mixture solution. The first mixture solution includes a first solvent and a first initial light-emitting material and a first initial functional material that are dissolved in the first solvent. The first initial light-emitting material is a raw material corresponding to the first light-emitting material. The first initial light-emitting material includes the first light-emitting particles 231 and the first photosensitive ligands combined with the first light-emitting particles 231. The first initial functional material is a raw material corresponding to the first functional material. The first initial functional material includes the first functional particles 221 and the second photosensitive ligands combined with the first functional particles 221. The first solvent is an organic solvent (an oily solvent), and may be one or more of toluene, chloroform, heptane and octane.

The first mixture solution may be prepared by a ligand exchange method. The method may include the following steps.

After the first light-emitting particles 231 are prepared, there are ligands (which may be referred to as initial ligands) combined with surfaces of the first light-emitting particles 231. In a case where the initial ligands do not meet requirements, e.g., photosensitive requirements, ligand exchange may be performed on the first light-emitting particles 231. The first photosensitive ligands are exchanged with the initial ligands, so that the surfaces of the first light-emitting particles 231 are combined with the first photosensitive ligands to obtain the first initial light-emitting material. The first initial light-emitting material may be in a solution state, and a solvent in the solution is the first solvent.

Similarly, ligand exchange is performed on the first functional particles 221, and the second photosensitive ligands are combined on surfaces of the first functional particles 221, so that the first initial functional material is obtained. The first initial functional material may be in a solution state, and a solvent in the solution is the first solvent.

The first initial light-emitting material and the first initial functional material are mixed together to obtain the first mixture solution.

Figure 6:
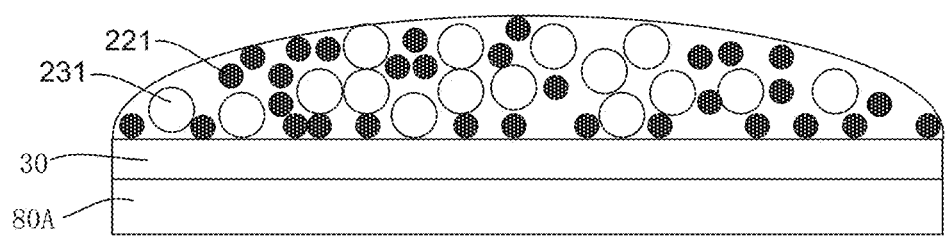
FIG. 6 is a diagram showing a process for forming a first mixture film, in accordance with some embodiments.
Figure 7:
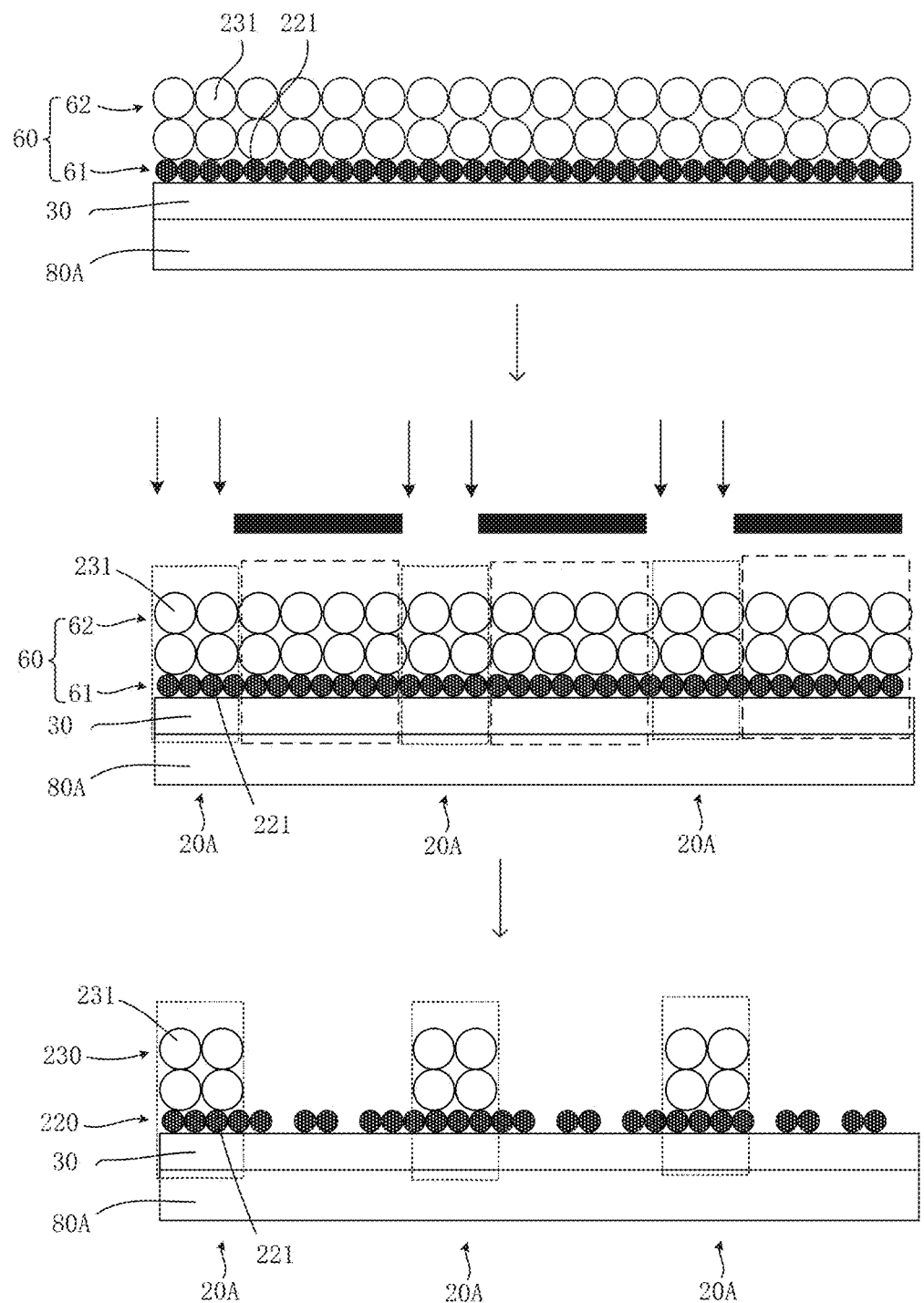
FIG. 7 is a diagram showing processes for forming a first light-emitting device, in accordance with some embodiments.

With reference to FIGS. 6 and 7, the first mixture film 60 includes both the first initial functional material and the first initial light-emitting material, and most of the first initial functional material is located below the first initial light-emitting material, i.e., is closer to the first electrode 210 than the first initial light-emitting material.

In the first mixture film 60, a structure formed by the first initial light-emitting material may be referred to as a first light-emitting portion 62 (whose structure is similar to a first light-emitting film 72 hereinafter) of the first mixture film 60; and a structure formed by the first initial functional material may be referred to as a first functional portion 61 (whose structure is similar to a first functional film 71 below) of the first mixture film 60.

With reference to FIG. 7, there are gaps in the first initial light-emitting material (e.g., between the quantum dots); and a thickness of the first light-emitting portion 62 of the first mixture film 60 is small. For example, the thickness of the first mixture film 60 is in a range of 30 nm to 50 nm, inclusive. In this case, light, such as ultraviolet (UV) rays, used for exposure may pass through the first light-emitting portion 62, and then be irradiated onto the first functional portion 61. In addition, energy of the UV rays is strong. Therefore, the first functional layer 220 and the first light-emitting pattern 230 may be formed by a single exposure and a single development that are performed on the first mixture film 60.

In the exposure step, the exposure is generally performed by means of a mask. The mask is provided therein with openings, and light can be irradiated to an underside of the mask through the openings. With continued reference to FIG. 7, in some embodiments, a shape of the openings of the mask may correspond to the first light-emitting pattern 230, i.e., corresponding to first regions 20A. A first region 20A is a region where the first light-emitting device 20 is located in the light-emitting substrate 1.

In this way, portions of the first mixture film 60 located in the first regions 20A are exposed regions. In the first mixture film 60, a shape of a pattern in the exposed regions corresponds to the first light-emitting pattern 230. First photosensitive ligands in the exposed regions produce first optically variable ligands. First photosensitive ligands in non-exposed regions remain unchanged. Similarly, second photosensitive ligands in the exposed regions produce second optically variable ligands. Second photosensitive ligands in the non-exposed regions remain unchanged.

A solubility of the first photosensitive ligands and a solubility of the first optically variable ligands in a developing solution are different from each other. One of the first photosensitive ligands and the first optically variable ligands can be dissolved and washed away by the developing solution, while the other one of the first photosensitive ligands and the first optically variable ligands are solidified in the developing solution and then not washed away by the developing solution. A characteristic of the first optically variable ligands to be dissolved or not be dissolved in the developing solution may be referred to as a development characteristic of the first optically variable ligands or photosensitive characteristic of the first photosensitive ligands.

Similarly, the second photosensitive ligands produce the second optically variable ligands in the exposure step. A solubility of the second photosensitive ligands and a solubility of the second optically variable ligands in a developing solution are different from each other. One of the second photosensitive ligands and the second optically variable ligands can be dissolved and washed away by the developing solution, while the other one of the second photosensitive ligands and the second optically variable ligands is solidified in the developing solution and then not washed away by the developing solution. A characteristic of the second optically variable ligands to be dissolved or not be dissolved in the developing solution may be referred to as a development characteristic of the second optically variable ligands or photosensitive characteristic of the second photosensitive ligands.

The first light-emitting pattern 230 and the first functional layer 220 of the first light-emitting device 20 have a same shape. Therefore, a development characteristic of the first ligands and a development characteristic of the second ligands need to be same as each other (which means that, the photosensitive characteristic of the first photosensitive ligands and the photosensitive characteristic of the second photosensitive ligands are same as each other), so that the first ligands and the second ligands are both dissolved or insoluble in a same developing solution.

It will be noted that, in a case development characteristics of two types of ligands are the same as each other, solubilities of the two types of ligands in a same developing solution are not necessary to be same as each other.

For example, a solubility of the first ligands in a developing solution and a solubility of the second ligands in the developing solution may be different from each other. For example, the solubility of the first ligands in the developing solution is greater than the solubility of the second ligands in the developing solution, and a difference between the solubility of the first ligands and the solubility of the first ligands in the developing solution is less than or equal to 40%. In this case, the first ligands and the second ligands may be different ligands.

Alternatively, the solubility of the first ligands in the developing solution is less than the solubility of the second ligands in the developing solution, and a ratio of the difference between the solubility of the first ligand and the solubility of the second ligands in the developing solution to the solubility of the second ligands in the developing solution is less than or equal to 40%. In this case, the first ligands and the second ligands may be different ligands.

For another example, the solubility of the first ligands in the developing solution and the solubility of the second ligands in the developing solution may be equal to each other. In this case, the first ligands and the second ligands may be same ligands.

The description "the photosensitive characteristic of the first photosensitive ligands and the photosensitive characteristic of the second photosensitive ligands are same as each other" refers to that, in a case where both the first photosensitive ligands and the second photosensitive ligands are exposed, the produced first optical variable ligands and the produced second optical variable ligands are same as each other in development characteristic, and the two may both be washed away by a developing solution, or neither of the two may be washed away by the developing solution; or in a case where the first photosensitive ligands and the second photosensitive ligands are not exposed, the first photosensitive ligands and the second photosensitive ligands are same as each other in development characteristic, and the two may both be washed away by a developing solution, or neither of the two may be washed away by the developing solution.

In the development step of these embodiments, the first optically variable ligands and the second optically variable ligands are insoluble in a developing solution, and are not washed away by the developing solution during the development step. The first photosensitive ligands and the second optically variable ligands located in the non-exposed regions maintain an original form, and are washed away by the developing solution during the development step. A development where a material in a non-exposed region is washed away by a developing solution may be referred to as a negative tone development. A patterning method including the negative tone development may be referred to as a negative lithography method correspondingly.

In this case, the first ligands are the first optically variable ligands. For example, the first ligands may be aminoethanethiol, cross-linked structures of mono-2-(methacryloyloxy)ethyl succinate (MMES), cross-linked structures of thiol-poly (ethylene glycol)-acrylate (abbreviated as thiol-PEG-acrylate) or bromoethylamine. Accordingly, the first photosensitive ligands may be 2-(tert-butoxycarbonyl-amino) ethanethiol (in view of "tert-butoxycarbonyl" is abbreviated as a Boc group, for convenience of description, "2-(tert-butoxycarbonyl-amino) ethanethiol" may be represented by "ligand Boc"), MMES (double bonds in MMES are cross-linked under light irradiation to form large cross-linked structures, i.e., the cross-linked structures of MMES), thiol-PEG-acrylate (having a molecular weight of 1K, and being cross-linked under light irradiation to form large cross-linked structures, i.e., the cross-linked structures of thiol-PEG-acrylate) or tert-butyl (2-bromoethyl) carbamate (also named as N-(tert-butoxycarbonyl)-2-bromoethylamine, abbreviated as N-Boc-bromoethylamine) (producing bromoethylamine under light irradiation). The developing solution may be one or more of chloroform, toluene, propylene glycol monomethyl ether acetate and octane.

For example, in a case where the first photosensitive ligands include 2-(tert-butoxycarbonyl-amino) ethanethiol, during application, in a presence of a photoacid generator (PAG, e.g., 2,4-bis(trichloromethyl)-6-(4-methoxystyryl)-1,3,5-triazine) and under ultraviolet (UV) irradiation, a Boc group may be removed from the 2-(2-(tert-butoxycarbonyl-amino) ethanethiol, so that 2-aminoethanethiol is produced, thereby changing a solubility. A specific reaction equation is shown in the following formula.

A reaction equation of 2-(2-(tert-butoxycarbonyl-amino) ethanethiol under light irradiation is as follows:

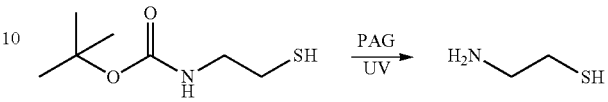

For another example, in a case where the photosensitive ligands include MMES, this type of ligands have the following characteristics: an end thereof being provided with a double bond, a triple bond, an acrylate bond, an oxirane or some other group using for crosslinking and curing under light irradiation, while another end thereof being provided with a coordination group such as sulfydryl, carboxyl or amino. During application, by using diphenyl(2,4,6-trimethylbenzoyl) phosphine oxide (TPO) as a photoinitiator, a double bond at the end of MMES ligand is cross linked under initiation of free radicals generated by TPO under light irradiation, so that a solubility is changed.

Similarly, the second ligands are the second optically variable ligands. For example, the second ligands may be aminoethanethiol, cross-linked structures of MMES, cross-linked structures of thiol-PEG-acrylate, or bromoethylamine. Correspondingly, the second photosensitive ligands may be 2-(tert-butoxycarbonyl-amino) ethanethiol, MMES, thiol-PEG-acrylate or N-Boc-bromoethylamine. In addition, the second ligands and the first ligands may be same or different. The developing solution may be one or more of chloroform, toluene, propylene glycol monomethyl ether acetate and octane.

Figure 8:
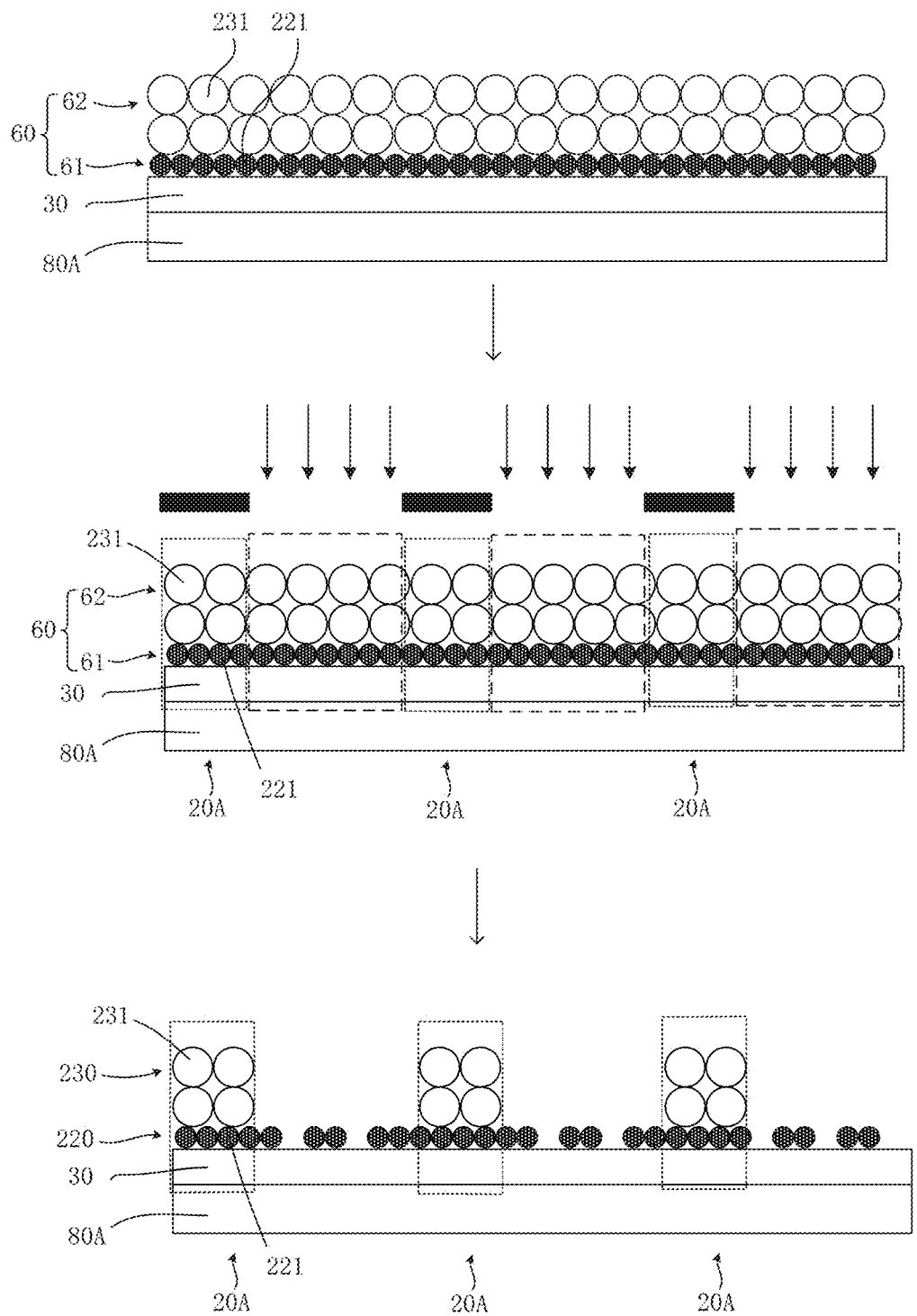
FIG. 8 is a diagram showing processes for forming another light-emitting device, in accordance with some embodiments.

In some other embodiments, with reference to FIG. 8, the openings of the mask are opposite to the first light-emitting pattern 230, i.e., correspond to regions, beyond the first regions 20A, of the substrate 10. The exposed regions are located the regions beyond the first regions 20A. Therefore, in the first mixture film 60, a shape of a pattern located in the exposed regions is opposite to the first light-emitting pattern 230.

First photosensitive ligands in the exposed regions generate first optically variable ligands. First photosensitive ligands in the non-exposed regions remain unchanged. Similarly, second photosensitive ligands in the exposed regions produce second optically variable ligands. Second photosensitive ligands in the non-exposed regions remain unchanged.

In the development step of these embodiments, the first optically variable ligands and the second optically variable ligands are dissolved in a developing solution, and washed away by the developing solution; and the first photosensitive ligands and the second photosensitive ligands located in the non-exposed regions maintain an original form, and are not washed away by the developing solution during the development step. A development where a material in an exposed region is washed away by a developing solution may be referred to as a positive tone development. A patterning method including the positive tone development may be referred to as a positive lithography method correspondingly.

In this case, the first ligands are the first photosensitive ligands. For example, the first ligands and the first photosensitive ligands are same as each other, and may be any one of 2-(tert-butoxycarbonyl-amino) ethanethiol, MMES, SH(CH$_2$CH$_2$O)$_n$COCHCH$_2$ (thiol-PEG-acrylate), and N-Boc-bromoethylamine. The developing solution may be methanol and/or ethanol. For example, the first photosensitive ligands are ligands Boc. The ligands Boc produce 2-aminoethanethiol under light irradiation, and the exposed regions may be washed away when development is performed with methanol or ethanol. Thus, a positive tone development is achieved.

Similarly, the second ligands are the second photosensitive ligands. The second ligands and the second photosensitive ligands are same as each other, and may be any one of 2-(tert-butoxycarbonyl-amino)ethiol, MMES, thiol-PEG-acrylate and N-Boc-bromoethylamine. In addition, the second ligands and the first ligands may be same or different. The developing solution may be methanol and/or ethanol.

Figure 9:
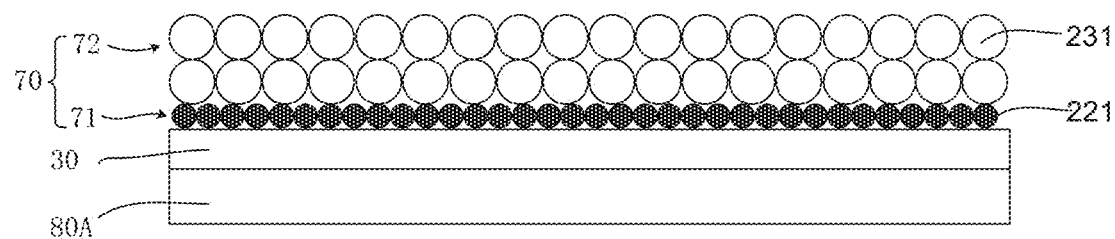
FIG. 9 is a diagram showing a process for forming a combined film structure, in accordance with some embodiments.

The above embodiments are embodiments where the first mixture film 60 are formed by using the first mixture solution, and the first mixture film 60 only undergoes a single film forming step, which may be referred to as a single-layer preparation process. With reference to FIG. 9, in some other possible implementations, a layer-by-layer preparation process may be used. That is, a first functional film 71 is firstly formed on the first electrode 210 or the auxiliary functional layer 30, and then a first light-emitting film 72 is formed on the first functional film 71. A combined film structure 70 formed by the first functional film 71 and the first light-emitting film 72 is similar to a structure of the first mixture film 60. The first light-emitting pattern 230 and the first functional layer 220 are formed by performing an exposure and a development on the combined film structure 70 formed by the first functional film 71 and the first light-emitting film 72.

The first functional film 71 may be formed by a coating process of a first functional solution. The first functional solution includes a third solvent and the first initial functional material dissolved in the third solvent. The first initial functional material is the raw material corresponding to the first functional material. The first initial functional material includes the first functional particles 221 and the second photosensitive ligands combined with the first functional particles 221. The third solvent is an organic solvent (an oily solvent), and may be one or more (e.g., one) of toluene, chloroform, heptane and octane.

The first light-emitting film 72 may be formed by a coating process of the first light-emitting solution. The first light-emitting solution includes a second solvent and the first initial light-emitting material dissolved in the second solvent. The first initial light-emitting material is the raw material corresponding to the first light-emitting material. The first initial light-emitting material includes the first light-emitting particles 231 and the first photosensitive ligands combined with the first light-emitting particles 231. The second solvent is an organic solvent (an oily solvent), and may be one or more (e.g., one) of toluene, chloroform, heptane and octane. The second solvent and the third solvent may be same as or different from each other.

The combined film structure 70 formed by the first functional film 71 and the first light-emitting film 72 has a structure similar to that of the first mixture film 60. A thickness of the first light-emitting film 72 is substantially equal to a thickness of a structure formed by the first light-emitting portion 62 of the first mixture film 60. A thickness of the first functional film 71 is substantially equal to a thickness of the first functional portion 61 of the first mixture film 60. In this way, the first functional layer 220 and the first light-emitting pattern 230 may be formed by a single exposure and a single development that are performed on the combined film structure 70.

For a specific exposure and a specific development step, reference may be made to corresponding exposure and development steps for forming the first mixture film 60.

For example, in a case where the shape of the openings of the mask corresponds to the first light-emitting pattern 230, a negative photolithography method may be used. With reference to FIG. 7, the first ligands are the first optically variable ligands. For example, the first ligands may be aminoethanethiol, cross-linked structures of MMES, cross-linked structures of thiol-PEG-acrylate, or bromoethylamine. Accordingly, the first photosensitive ligands may be 2-(tert-butoxycarbonyl-amino) ethanethiol, MMES, thiol-PEG-acrylate or N-Boc-bromoethylamine. The developing solution may be one or more of chloroform, toluene, propylene glycol monomethyl ether acetate and octane.

The second ligands are the second optically variable ligands. For example, the second ligands may be aminoethanethiol, cross-linked structures of MMES, cross-linked structures of thiol-PEG-acrylate, or bromoethylamine. Correspondingly, the second photosensitive ligands may be 2-(tert-butoxycarbonyl-amino) ethanethiol, MMES, thiol-PEG-acrylate or N-Boc-bromoethylamine. In addition, the second ligands and the first ligands may be same as or different from each other. The developing solution may be one or more of chloroform, toluene, propylene glycol monomethyl ether acetate and octane.

For another example, in a case where the openings of the mask are opposite to the first light-emitting pattern 230, i.e., correspond to the regions, located outside the first regions 20A, of the substrate 10, a positive photolithography method may be used. The first ligands are the first photosensitive ligands. With reference to FIG. 8, for example, the first ligands and the first photosensitive ligands are same, and may be any one of ligands Boc, MMES, thiol-PEG-acrylate and N-Boc-bromoethylamine. The developing solution may be methanol and/or ethanol.

Similarly, the second ligands are the second photosensitive ligands. The second ligands and the second photosensitive ligands are same, and may be any one of ligands Boc, MMES, thiol-PEG-acrylate and N-Boc-bromoethylamine. In addition, the second ligands and the first ligands may be same or different. The developing solution may be methanol and/or ethanol.

In related art, incomplete elution of the quantum dot light-emitting material is mainly caused by an interaction force such as a physical adsorption (van der Waals force, capillary force or hydrogen bond) or a chemical reaction (bonding between ligands of the quantum dots and atoms in a film layer) between the film layer in contact with quantum dots and the quantum dot, and the interaction force have the quantum dots adsorbed on the film layer. Such an interaction force is relatively weak.

In the light-emitting substrate 1, the first electrode 210, the first functional layer 220 and the first light-emitting pattern 230 are sequentially disposed in the direction away from the substrate 10, the first functional layer 220 is closer to the first electrode 210 than the first light-emitting pattern 230, and the first light-emitting pattern 230 is located on the first functional layer 220. In view of this, in a production process, the first initial functional material is located below the first initial light-emitting pattern. Due to an action of an interaction force between the first initial functional material and the first electrode 210 or some other film layer, during development, the first initial functional material or an exposed first initial functional material is eluted incompletely, and a small amount of the first functional particles 221 remains. Since the interaction force is relatively weak, and the development characteristics of the first ligands and the second ligands are the same as each other, the first initial light-emitting material or the exposed first initial light-emitting material is washed away by the developing solution, and little residual is remained on the first functional particles 221. When the light-emitting substrate 1 is provided with a light-emitting device (e.g., a second light-emitting device 40) of another color in a region without the first light-emitting device, the second light-emitting device 40 is disposed on the remaining small amount of the first functional particles 221. Since the first functional particles 221 do not emit light, the problem of color mixing is avoided, and only light, which is generated from excitation of the second light-emitting particles 431 of the second light-emitting device 40, of a color corresponding to the second light-emitting particles 431 is emitted. Therefore, a problem of residue of the first light-emitting material is effectively avoided in the light-emitting substrate 1, which reduces a probability of a problem of color mixing.

In some embodiments, a particle diameter of the first functional particles 221 is less than a particle diameter of the first light-emitting particles 231. A particle diameter of particles affects a migration rate of the particles in a solution. Particles with a smaller particle diameter have a faster migration rate in the solution than particles with a larger particle diameter.

In this case, the first functional layer 220 and the first light-emitting pattern 230 may be formed by the single-layer preparation process. For example, the first initial light-emitting material and the first initial functional material may be dissolved in a same solvent to prepare the first mixture solution (since including the first light-emitting particles 231, the first mixture solution may also be referred to as a solution containing a light-emitting material). In the solution containing the light-emitting material, a migration rate of the first functional particles 221 is greater than a migration rate of the first light-emitting particles 231. Therefore, a migration rate of the first initial functional material is greater than a migration rate of the first initial light-emitting material, and the first initial functional material may be rapidly combined with the auxiliary functional layer 30 or the first electrode 210. Therefore, in the formed first mixture film 60, most of the first initial functional material is located below the first initial light-emitting material, so that the first functional layer 220 and the first light-emitting pattern 230 may be formed by a single exposure and a single development that are performed on the first mixture film 60. Therefore, in a case where the particle diameter of the first functional particles 221 is less than the particle diameter of the first light-emitting particles 231, the first functional layer 220 and the first light-emitting pattern 230 may be formed by using the process where the first initial light-emitting material and the first initial functional material are prepared into the first mixture film 60. In this way, a film forming process is shortened, and production efficiency is improved.

It will be understood that, in this case, the first functional layer 220 and the first light-emitting pattern 230 may also be formed by using the layer-by-layer preparation process.

In some embodiments, the particle diameter of the first functional particles 221 is in a range of 2 nm to 7 nm, inclusive. In this way, in a case where the formation of the first functional layer 220 and the first light-emitting pattern 230 adopts the single-layer preparation process, the migration rate of the first initial functional material is relatively fast, and then may be quickly combined with the auxiliary functional layer 30 or the first electrode 210, which further increases a proportion, located below the first initial light-emitting material, of the first initial functional material during the single-layer preparation process. As a result, the problem of residue of the first light-emitting material is effectively avoided in the light-emitting substrate 1, which further reduces the probability of the problem of color mixing in the first light-emitting device 20.

In some embodiments, the first functional layer 220 further includes third ligands, and the third ligands are combined with the first functional particles 221. A chain length of the third ligands is less than a chain length of the first ligands. The third ligands may be photosensitive ligands having a chain length less than the chain length of the first ligands. The third ligands may also be non-photosensitive ligands having a chain length less than the chain length of the first ligands. For example, the third ligands may be ligands such as pentathiol, hexanethiol, thioethyl acetate, valeric acid or hexylamine.

In this case, the first functional layer 220 and the first light-emitting pattern 230 may be formed by using the single-layer preparation process. The first ligands of the first functional layer 220 are the first photosensitive ligands. That is, in the exposure step, the first ligands and the third ligands of the first functional layer 220 are in the non-exposed regions of the first mixture film 60. The first solvent used in the solution containing the light-emitting material is an organic solvent.

Generally, the shorter a chain length of ligands, the poorer a solubility of the ligands in an oily solvent. Thus, a solubility of the third ligands in the first solvent is less than a solubility of the first ligands in the first solvent. Further, a solubility of the first initial functional material in the first solvent is less than a solubility of the first initial light-emitting material in the first solvent. In this way, the first initial functional material is relatively easily precipitated in the first solvent and then sedimented downward to be combined with the auxiliary functional layer 30 or the first electrode 210, so that the first initial functional material is located below the first initial light-emitting material. Therefore, the problem of residue of the first light-emitting material is effectively avoided in the light-emitting substrate 1, which further reduces the probability of the problem of color mixing in the light-emitting substrate 1.

It will be understood that, in this case, the first functional layer 220 and the first light-emitting pattern 230 may also be formed by using the layer-by-layer preparation process.

In some embodiments, the first functional layer 220 further includes the third ligands, and the third ligands are combined with the first functional particles 221. The chain length of the third ligands is less than a chain length of the first photosensitive ligands. The first ligands are products of the first photosensitive ligands under light irradiation. The third ligands may be non-photosensitive ligands having a chain length less than the chain length of the first photosensitive ligands.

In this case, the first functional layer 220 and the first light-emitting pattern 230 may be formed by using the single-layer preparation process. The first ligands of the first functional layer 220 are the products of the first photosensitive ligands under light irradiation. That is, in the exposure step, the first ligands of the first functional layer 220 are located in the exposed regions of the film structure. Thus, in the solution containing the light-emitting material, ligands combined with the first initial light-emitting material are the first photosensitive ligands. In a case where the chain length of the third ligands is less than the chain length of the first photosensitive ligands, the solubility of the third ligands in the first solvent is less than a solubility of the first photosensitive ligands in the first solvent. Further, the solubility of the first initial functional material in the first solvent is less than the solubility of the first initial light-emitting material in the first solvent. In this way, the first initial functional material is easily precipitated in the first solvent and then sedimented downward to be combined with the auxiliary functional layer 30 or the first electrode 210, so that the first initial functional material is located below the first initial light-emitting material. Therefore, the problem of residue of the first light-emitting material is effectively avoided in the light-emitting substrate 1, which further reduces the probability of the problem of color mixing in the light-emitting substrate 1.

In some embodiments, for the first functional particle 221, a ratio of a number of the second ligands to a sum of the number of the second ligands and a number of the third ligands is in a range of 1/2 to 2/3, inclusive.

All of the second ligands and the third ligands combined with the first functional particles 221 may be referred to as total ligands. Since the second ligands are the key for forming the first functional layer 220 by performing exposure and development on the first mixture film 60 or the combined film structure 70, the number of the second ligands needs to be relatively large. A role of the third ligands is to reduce the solubility of the first initial functional material, so that the migration rate of the first initial functional material in the solution containing the light-emitting material is improved, thereby improving an adsorption rate of the first initial functional material on the auxiliary functional layer 30 or the first electrode 210. In addition, as long as the solubility of the first initial functional material in the solution containing the light-emitting material is less than the solubility of the first initial light-emitting material in the solution containing the light-emitting material, e.g., slightly less than the solubility of the first initial light-emitting material, it may be possible to make the adsorption rate of the first initial functional material on the auxiliary functional layer 30 or the first electrode 210 greater than an adsorption rate of the first initial light-emitting material on the auxiliary functional layer 30 or the first electrode 210. Thus, the number of the third ligands may be relatively small. It is appropriate that, a ratio of the number of the second ligands to a number of the total ligands is in the range of 1/2 to 2/3, inclusive, and a ratio of the number of the third ligands to the number of the total ligands is in a range of 1/3 to 1/2, inclusive.

In some embodiments, in the first light-emitting pattern 230, a ratio of a number of the first light-emitting particles 231 to a sum of the number of the first light-emitting particles 231 and a number of the first functional particles 221 is in a range of 66/100 to 80/100, inclusive.

All of the first light-emitting particles 231 and all of the first functional particles 221 of the first light-emitting pattern 230 may be referred to as total particles. Only a layer of first functional particles 221 is need to be adsorbed on the auxiliary functional layer 30 or the first electrode 210 to separate the first light-emitting particles 231, thus the number of the first functional particles 221 may be relatively small. The first light-emitting particles 231 are a key structure for the first light-emitting device 20 to emit light, and the number of the first light-emitting particles 231 is related to a light-emitting intensity of the first light-emitting device 20. Thus, the number of first light-emitting particles 231 should satisfy that there may be 2 to 4 layers of first light emitting particles 231 spread on the layer of the first functional particles 221. Therefore, the number of the first light-emitting particles 231 of the first light-emitting pattern 230 accounts for 66/100 to 80/100 of a number of the total particles of the first light-emitting pattern 230.

In some embodiments, in order to further improve the light-emitting efficiency of the first light-emitting device 20, with reference to FIGS. 5 to 13, the light-emitting substrate 1 further includes an auxiliary functional layer 30. The auxiliary functional layer 30 is a layer, other than the first functional layer 220, of the carrier auxiliary layers. The auxiliary functional layer 30 is located between the first electrode 210 and the first functional layer 220. For example, in a case where the first functional layer 220 is a hole transport layer, the auxiliary functional layer 30 is a hole injection layer. The hole injection layer is located between the first electrode 210 and the hole transport layer.

It will be understood that, the light-emitting substrate 1 may further include one or more layers, other than the first functional layer 220 and the auxiliary functional layer 30, of the carrier auxiliary layers. For example, in a case where the first functional layer 220 is a hole transport layer and the auxiliary functional layer 30 is a hole injection layer, the light-emitting substrate 1 further includes at least one of an electron injection layer and an electron transport layer. At least one of the electron injection layer and the electron transport layer is located between the first light-emitting pattern 230 and the second electrode 240.

Figure 10:
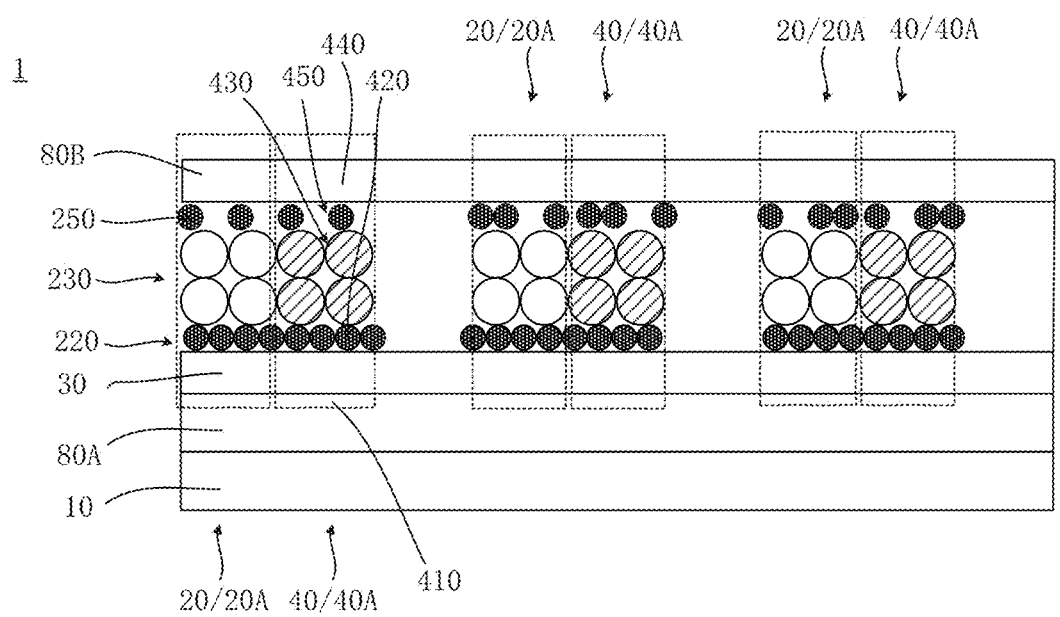
FIG. 10 is a sectional view of yet another substrate, in accordance with some embodiments.

In some embodiments, with reference to FIG. 10, the light-emitting substrate 1 further includes at least one second light-emitting device 40 (e.g., one or more second light-emitting devices 40). A color of light emitted by the second light-emitting device 40 is different from the color of light emitted by the first light-emitting device 20. For example, in a case where the first light-emitting device 20 is a red light-emitting device, the second light-emitting device 40 is a green light-emitting device or a blue light-emitting device.

The second light-emitting device 40 includes a third electrode 410, a second functional layer 420, a second light-emitting pattern 430 and a fourth electrode 440 that are sequentially disposed in the direction away from the substrate 10. The second functional layer 420 is in contact with the second light-emitting pattern 430. A region where the second light-emitting device 40 is located on the light-emitting substrate 1 may be referred to as a second region 40A.

For a light-emitting principle of the second light-emitting device 40, reference may be made to a light-emitting principle of the first light-emitting device 20, which will not be repeated here. The second light-emitting device 40 and the first light-emitting device 20 are both located on the light-emitting substrate 1, so that the third electrode 410 and the first electrode 210 may be made of a same material and disposed in a same layer. The fourth electrode 440 and the second electrode 240 may be made of a same material and disposed in a same layer. That is, the first electrode 210 and the third electrode 410 are located in the first electrode pattern layer 80A. The second electrode 240 and the fourth electrode 440 are located in the second electrode pattern layer 80B.

It will be noted that, in embodiments of the present disclosure, "same layer" refers to a layer structure formed by forming a film layer for forming a specific pattern through a same film forming process (e.g., a coating process) and then performing a single patterning process using a same mask. Depending on different specific patterns, the patterning process may include a plurality of exposure processes, development processes or etching processes, the specific patterns in the formed layer structure may be continuous or discontinuous, and these specific patterns may also be at different heights or have different thicknesses.

The second light-emitting pattern 430 is mainly composed of a second light-emitting material. The second light-emitting material includes second light-emitting particles 431 (with reference to FIGS. 11 and 13) and fourth ligands combined with the second light-emitting particles 431. The second light-emitting particles 431 may be selected with reference to the first light-emitting particles 231.

For example, a shape and a material of the second light-emitting particles 431 may be same as the shape and the material of the first light-emitting particles 231. For example, the second light-emitting particles 431 and the first light-emitting particles 231 are both spherical CdSe nanoparticles. A particle diameter of the second light-emitting particles 431 is different from the particle diameter of the first light-emitting particles 231, so that the second light-emitting particles 431 and the first light-emitting particle 231 emit light of different colors from each other.

For example, the second light-emitting particles 431 are different from the first light-emitting particles 231 in shape and/or material (e.g., in both shape and material). For example, the first light-emitting particles 231 are spherical CdSe nanoparticles, and the second light-emitting particles 431 are spherical PbS/ZnS nanoparticles. In this case, the second light-emitting particles 431 and the first light-emitting particles 231 emit light of different colors from each other.

The fourth ligands may be selected with reference to the first ligands of the first light-emitting device 20, which will not be repeated here. The fourth ligands and the first ligands may be same as or different from each other.

The second functional layer 420 is mainly composed of a second functional material. The second functional material includes second functional particles 421 and fifth ligands combined with the second functional particles 421. The second functional particles 421 may be selected with reference to the first functional particles 221 of the first functional material, which will not be repeated here. The second functional particles 421 and the first functional particles 221 may be same as or different from each other. The fifth ligands may be selected with reference to the second ligands of the first functional material, which will not be repeated here. The fifth ligands and the second ligands may be same as or different from each other.

A development characteristic of the fourth ligands is same as a development characteristic of the fifth ligands. Similarly, in this case, the fourth ligands and the fifth ligands may be same as or different from each other.

For a method for forming the second functional layer 420 and the second light-emitting pattern 430, reference may be made to the method for forming the first functional layer 220 and the first light-emitting pattern 230 such as the single-layer preparation process (e.g., a positive photolithography method or a negative photolithography method) or the layer-by-layer preparation process (e.g., a positive photolithography method or a negative photolithography method). For a negative photolithography method in the single-layer preparation process, reference may be made to FIG. 11, which will be repeated here.

In some embodiments, the second functional layer 420 further includes sixth ligands. The sixth ligands are combined with the second functional particles 421. A chain length of the sixth ligands is less than a chain length of the fourth ligands.

A role and a structure of the sixth ligands may be selected with reference to the third ligands of the first light-emitting material, which will not be repeated here. The sixth ligands may be same as or different from the third ligands.

It will be understood that, on a second functional particle 421, a ratio of a number of fifth ligands to a sum of the number of the fifth ligands and a number of sixth ligands may be determined with reference to the proportions of the ligands on the first functional particle 221, and proportions of the fifth ligands and the sixth ligands may be same as or different from the proportions of the ligands on the first functional particles 221.

A ratio of a number of the second light-emitting particles 431 of the second light-emitting pattern 430 to a sum of the number of the second light-emitting particles 431 and a number of the second functional particles 421 of the second light-emitting pattern 430 may be determined with reference to the proportions of the particles of the first light-emitting pattern 230, and proportions of the second light-emitting particles 431 and the second functional particles 421 may be same as or different from the proportions of the particles of the first light-emitting pattern 230.

Since a structure of the second light-emitting device 40 is similar to a structure of the first light-emitting device 20, residue of the second light-emitting material may be effectively avoided in the light-emitting substrate 1, which reduces the probability of the problem of color mixing in the light-emitting substrate 1.

Figure 12:
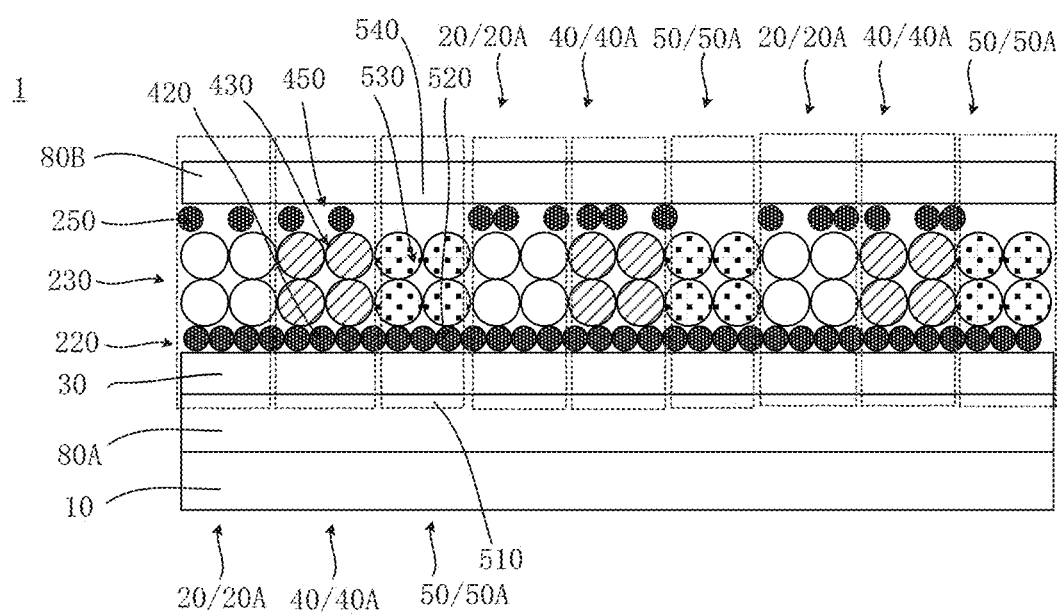
FIG. 12 is a sectional view of yet another substrate, in accordance with some embodiments.

With reference to FIG. 12, in some embodiments, the light-emitting substrate 1 further includes at least one third light-emitting device 50 (e.g., one or more third light-emitting devices 50). A color of light emitted by the third light-emitting device 50 is different from the color of the light emitted by the first light-emitting device 20 and the color of the light emitted by the second light-emitting device 40. For example, in a case where the first light-emitting device 20 is a red light-emitting device, and the second light-emitting device 40 is a green light-emitting device, the third light-emitting device 50 is a blue light-emitting device. A region where the third light-emitting device 50 is located on the light-emitting substrate 1 may be referred to as a third region 50A.

The third light-emitting device 50 includes a fifth electrode 510, a third functional layer 520, a third light-emitting pattern 530 and a sixth electrode 540 that are sequentially disposed in the direction away from the substrate 10. The third functional layer 520 is in contact with the third light-emitting pattern 530.

For a light-emitting principle of the third light-emitting device 50, reference may be made to the light-emitting principle of the first light-emitting device 20, which will not be repeated here. The third light-emitting device 50, the second light-emitting device 40 and the first light-emitting device 20 are all located on the light-emitting substrate 1, so that the fifth electrode 510 may be in a same layer as the third electrode 410 and/or the first electrode 210 (for example, the fifth electrode 510, the third electrode 410 and the first electrode 210 are all made of a same material and located in the same layer, e.g., the first electrode pattern layer 80A). The sixth electrode 540 may be in a same layer as the fourth electrode 440 and/or the second electrode 240 (for example, the sixth electrode 540, the fourth electrode 440 and the second electrode 240 are all made of a same material and located in the same layer, e.g., the second electrode pattern layer 80B).

The third light-emitting pattern 530 is mainly composed of a third light-emitting material. The third light-emitting material includes third light-emitting particles 531 (with reference to FIG. 13) and seventh ligands combined with the third light-emitting particles 531. The third light-emitting particles 531 may be selected with reference to the first light-emitting particles 231.

For example, the third light-emitting particles 531, the second light-emitting particles 431 and the first light-emitting particles 231 may be same as each other in shape and material. For example, the third light-emitting particles 531, the second light-emitting particles 431 and the first light-emitting particles 231 are all spherical ZnSe nanoparticles. A particle diameter of the third light-emitting particle 531, the particle diameter of the second light-emitting particle 431 and the particle diameter of the first light-emitting particle 231 are different from each other, so that the third light-emitting particles 531, the second light-emitting particles 431 and the first light-emitting particles 231 emit light of different colors from each other.

For example, the third light-emitting particles 531 may be different from the first light-emitting particles 231 in shape and/or material (e.g., in material, or in both shape and material). The third light-emitting particle 531 may be different from the second light-emitting particle 431 in shape and/or material (e.g., in material, or in both shape and material). For example, the first light-emitting particles 231 are spherical CdSe nanoparticles, the second light-emitting particles 431 are spherical $CsPbCl_3$ nanoparticles, and the third light-emitting particles 531 are spherical PbS/ZnS nanoparticles. In this case, the third light-emitting particles 531, the second light-emitting particles 431 and the first light-emitting particles 231 emit light of different colors from each other.

The seventh ligands may be selected with reference to the first ligands of the first light-emitting device 20, which will not be repeated here. At least two of the seventh ligands, the fourth ligands and the first ligands may be same as each other (for example, the three are completely the same as each other), or completely different from each other.

The third functional layer 520 is mainly composed of a third functional material. The third functional material includes third functional particles 521 (with reference to FIG. 13) and eighth ligands combined with the third functional particles 521. A development characteristic of the seventh ligands is same as a development characteristic of the eighth ligands.

The third functional particles 521 may be selected with reference to the first functional particles 221 of the first functional material, which will not be repeated here. At least two of the third functional particles 521, the second functional particles 421 and the first functional particles 221 may be same as each other (for example, the three are completely the same as each other), or completely different from each other.

The eighth ligands may be selected with reference to the second ligands of the first functional material, which will not be repeated here. At least two of the eighth ligands, the fifth ligands and the second ligands may be same as each other (for example, the three are completely the same as each other), or completely different from each other.

For a method for forming the third functional layer 520 and the third light-emitting pattern 530, reference may be made to the method for forming the first functional layer 220 and the first light-emitting pattern 230, such as the single-layer preparation process (e.g., a positive photolithography method or a negative photolithography method) or the layer-by-layer preparation process (e.g., a positive photolithography method or a negative photolithography method).

Figure 13:
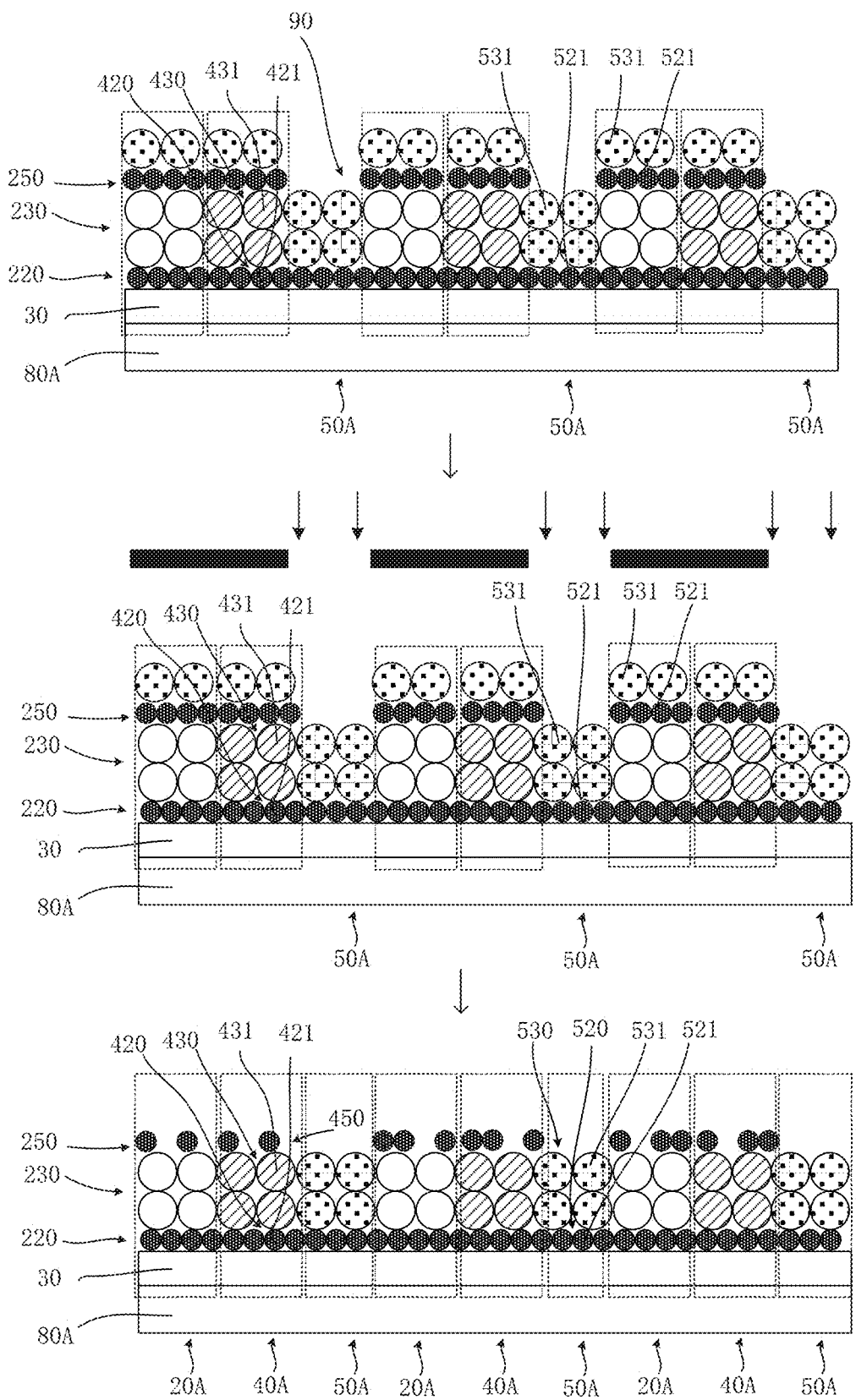
FIG. 13 is a diagram showing processes for forming a third light-emitting device, in accordance with some embodiments.

For a negative photolithography method in the single-layer preparation process, reference may be made to FIG. 13, which is repeated here.

In some embodiments, the third functional layer 520 further includes ninth ligands. The ninth ligands are combined with the third functional particles 521. A chain length of the ninth ligands is less than a chain length of the seventh ligands.

A role and a structure of the ninth ligands may be selected with reference to that of the third ligands of the first light-emitting material, which will not be repeated here. At least two of the ninth ligands, the sixth ligands and the third ligands may be same as each other (for example, the three are completely the same as each other), or completely different from each other.

It will be understood that, on a third functional particle 521, a ratio of a number of eighth ligands to a sum of the number of the eighth ligands and a number of ninth ligands is determined with reference to the proportions of the ligands of the first functional particles 221. Moreover, at least two of proportions of the ligands on the first functional particle 221, the proportions of the ligands on the second functional particle 421, and the proportions of the ligands on the third functional particle 521 may be same as each other (e.g., the three are completely the same as each other), or completely different from each other.

A ratio of a number of the third light-emitting particles 531 of the third light-emitting pattern 530 to a sum of the number of the third light-emitting particles 531 and a number of the third functional particles 521 of the third light-emitting pattern 530 is determined with reference to the proportions of the particles of the first light-emitting pattern 230. Moreover, at least two of the proportions of the particles of the first light-emitting pattern 230, the proportions of the particles of the second light-emitting pattern 430, and proportions of the particles of the third light-emitting pattern 530 may be same as each other (e.g., the three are completely the same as each other), or completely different from each other.

Since a structure of the third light-emitting device 50 is similar to the structure of the first light-emitting device 20, residue of the third light-emitting material may be avoided in the light-emitting substrate 1, which reduces the probability of the problem of color mixing in the light-emitting substrate 1.

In some embodiments, with reference to FIGS. 12 and 13, two of the first light-emitting device 20, the second light-emitting device 40 and the third light-emitting device 50 include material layers. For example, the first light-emitting device 20 includes a first material layer 250. The second light-emitting device 40 includes a second material layer 450. A material of the first material layer 250 is same as a material of the second functional layer 420.

Figure 11:
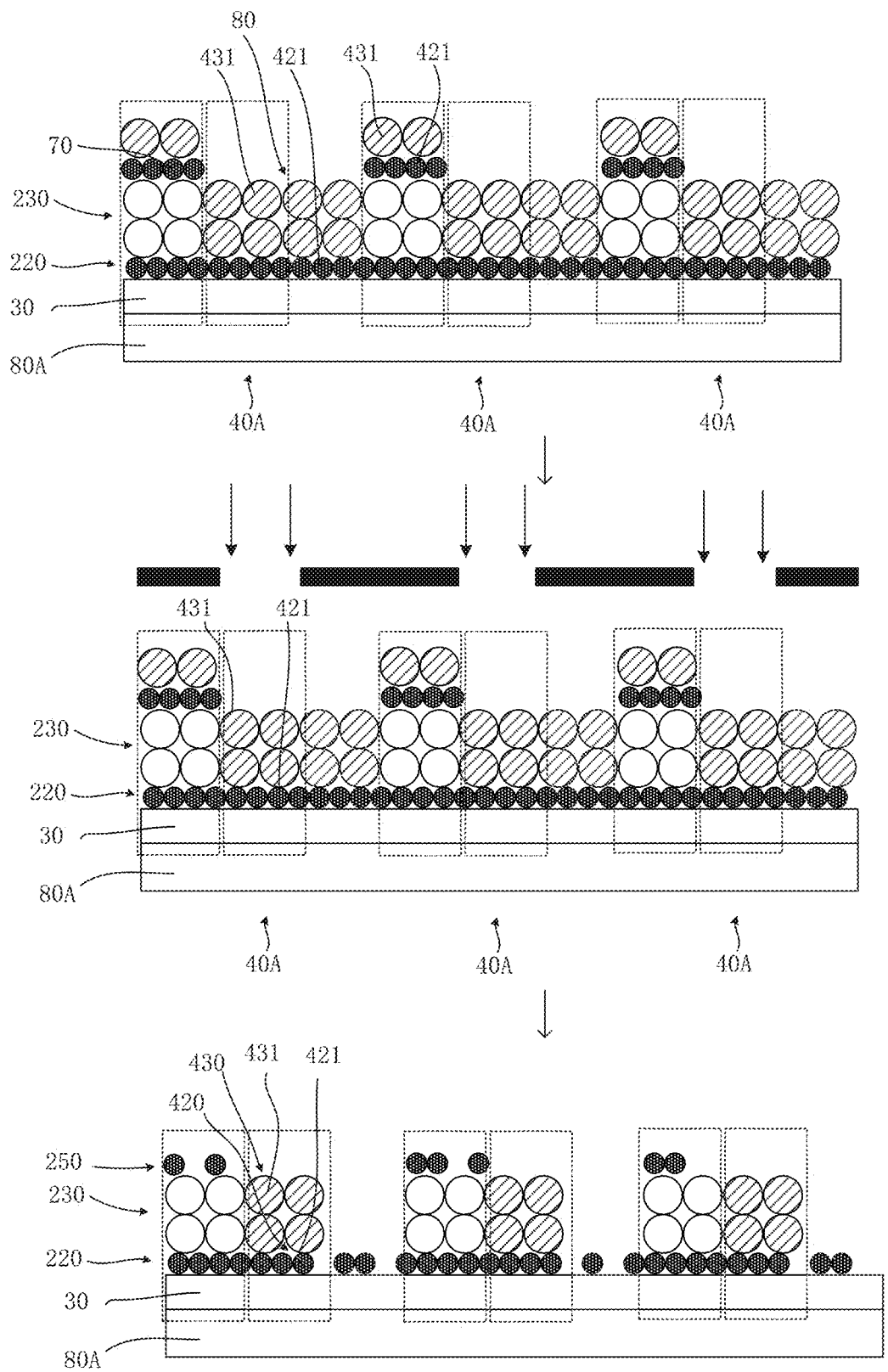
FIG. 11 is a diagram showing processes for forming a second light-emitting device, in accordance with some embodiments.

Formations of the first light-emitting device 20, the second light-emitting device 40 and the third light-emitting device 50 follow a chronological order. With reference to FIGS. 11 to 13, the light-emitting substrate 1 is manufactured according to an order of the first light-emitting device 20, the second light-emitting device 40 and the third light-emitting device 50. During a manufacturing step, a film structure of a light-emitting device formed later covers a light-emitting pattern of a light-emitting device formed first. Therefore, a film structure formed in a step for forming the second light-emitting device 40 covers the first light-emitting pattern 230 of the first light-emitting device 20. After the film structure is developed and exposed, in addition to residue, in a region (the second region 40A) of the second light-emitting device 40, of second functional particles 421 on the auxiliary functional layer 30 or the third electrode 410, there is also a layer of residue of second functional particles 421 on the first light-emitting pattern 230, and the layer of the residue of the second functional particles 421 may be referred to as the first material layer 250. Therefore, the material of the first material layer 250 is same as a second functional material of the second functional layer 420 of the second light-emitting device 40. In addition, the first material layer 250 is located on a surface of the first light-emitting pattern 230 away from the substrate 10. That is, the first material layer 250 is located between the first light-emitting pattern 230 and the second electrode 240, and in contact with the first light-emitting pattern 230.

Similarly, with reference to FIG. 13, in a step for forming the third light-emitting device 50, the second material layer 450 of the second light-emitting device 40 is formed. A material of the second material layer 450 is same as a material of the third functional layer 520. The second material layer 450 is located on a surface of the second light-emitting pattern 430 away from the substrate 10. That is, the second material layer 450 is located between the second light-emitting pattern 430 and the fourth electrode 440, and in contact with the second light-emitting pattern 430.

Since the third light-emitting device 50 is a light-emitting device formed last, no film is formed on the third light-emitting pattern 530 by forming a light-emitting pattern of some other light-emitting device. Thus, the third light-emitting device 50 does not include a material layer.

In some embodiments, the light-emitting substrate 1 includes the first light-emitting device 20, the second light-emitting device 40 and the third light-emitting device 50. The particle diameter of the first light-emitting particles 231 and the particle diameter of the second light-emitting particles 431 are both greater than the particle diameter of the third light-emitting particles 531. The first light-emitting particles 231, the second light-emitting particles 431 and the third light-emitting particles 531 are all of quantum dot light-emitting materials. In this case, the third light-emitting device 50 is a blue light-emitting device, one of the first light-emitting device 20 and the second light-emitting device 40 is a red light-emitting device, and the other of the first light-emitting device 20 and the second light-emitting device 40 is a green light-emitting device. For example, the first light-emitting device 20 is a red light-emitting device, and the second light-emitting device 40 is a green light-emitting device.

In a case where the first electrode pattern layer 80A is a cathode, and the second electrode pattern layer 80B is an anode, the red light-emitting device and the green light-emitting device are many-electron devices, and the blue light-emitting device is a many-hole device. In this case, the first functional layer 220 is a P-type semiconductor, the second functional layer 420 is a P-type semiconductor, and the third functional layer 250 is an N-type semiconductor.

Some embodiments of the present disclosure provide a solution containing a light-emitting material. The solution containing the light-emitting material is a raw material for forming a film structure of the first light-emitting device 20. The solution containing the light-emitting material includes the first solvent and the first initial light-emitting material and the first initial functional material dissolved in the first solvent. The first initial light-emitting material includes the first light-emitting particles 231 and the first photosensitive ligands combined with the first light-emitting particles 231. The first initial functional material includes the first functional particles 221 and the second photosensitive ligands combined with the first functional particles 221. The photosensitive characteristic of first photosensitive ligands is the same as the photosensitive characteristic of the second photosensitive ligands.

Influence factors of the migration rates of the first initial functional material and the first initial light-emitting material in the first solvent at least include: solubilities of the materials in the first solvent (a material having a small solubility has a large migration rate), particle diameters (also be referred to as particle sizes, particles of a small particle diameter having a large migration rate) of the materials in the first solvent, and properties of particles contained in the materials (natural adsorption characteristics of the particles on a material of the auxiliary functional layer 30 or the first electrode 210, a material containing particles with good adsorption characteristics having a large migration rate). By adjusting at least one of the influence factors described above, it may be possible to make the migration rate of the first initial functional material in the first solvent greater than the migration rate of the first initial light-emitting material in the first solvent.

In this way, in a case where the first light-emitting device 20 is formed by the solution containing the light-emitting material (referred to as the first mixture solution hereinafter), after the auxiliary functional layer 30 or the first electrode 210 is coated with the first mixture solution thereon, the first initial functional material is adsorbed on the auxiliary functional layer 30 or the first electrode 210 prior to the first initial light-emitting material since the migration rate of the first initial functional material in the first solvent is greater than the migration rate of the first initial light-emitting material in the first solvent. Therefore, after the first solvent evaporates (for example, in a case where coating of the first mixture solution is performed by spin coating, and the first solvent evaporates due to heating in the spin coating step), the first initial functional layer in the first mixture film 60 formed by the first mixture solution is located below the first initial light-emitting pattern in the first mixture film 60.

After exposure and development, the first initial functional material or an exposed first initial functional material is eluted incompletely, and a small amount of the first functional particles 221 remains. Since an interaction force is relatively weak, and the first ligands and the second ligands have the same development characteristic, the first initial light-emitting material or the exposed first initial light-emitting material is washed away by a developing solution, and little residual thereof is remained on the first functional particles 221. In a case where the light-emitting substrate 1 is provided with a light-emitting device (e.g., the second light-emitting device 40) of some other color in a region without the first light-emitting device, the second light-emitting device 40 is disposed on the remaining small amount of the first functional particles 221. Since the first functional particles 221 do not emit light, the problem of color mixing is avoided, and only light, which is generated from excitation of the second light-emitting particles 431 of the second light-emitting device 40, of a color corresponding to the second light-emitting particles 431 is emitted. Therefore, the problem of residue of the first light-emitting material is effectively avoided in the light-emitting substrate 1, which reduces the probability of the problem of color mixing in the light-emitting substrate 1.

In addition, by performing a single coating with the first mixture solution, the film structure including both the first initial functional layer and the first initial light-emitting pattern may be formed. Therefore, a process for forming the film structure is shortened, and the production efficiency is improved.

It may be possible to make the migration rate of the first initial functional material in the first solvent greater than the migration rate of the first initial light-emitting material in the first solvent by making an adjustment in solubility. In some embodiments, the solubility of the first initial functional material in the first solvent is less than the solubility of the first initial light-emitting material in the first solvent.

Influence factors of the solubilities of the first initial functional material and the first initial light-emitting material in the first solvent at least include a chain length of ligands, a number of branches of the ligands and a matching degree between a functional group of the ligands and a functional group of the first solvent. By adjusting at least one of the influence factors described above, it may be possible to make the solubility of the first initial functional material in the first solvent less than the solubility of the first initial light-emitting material in the first solvent. In this way, the first initial functional material is easily precipitated in the first solvent and then sedimented downward to be combined with the auxiliary functional layer 30 or the first electrode 210, so that the first initial functional material is located below the first initial light-emitting material. Therefore, the problem of residue of the first light-emitting material is effectively avoided in the light-emitting substrate 1, which further reduces the probability of the problem of color mixing in the light-emitting substrate 1.

In some embodiments, the solution containing the light-emitting material further includes the third ligands. The third ligands are combined with the first functional particles 221. The first functional particles 221 are combined with the second ligands and the third ligands. The solubility of the first functional material in the first solvent depends mainly on the second ligands and the third ligands. The solubility of the third ligands in the first solvent is less than the solubility of the first photosensitive ligands in the first solvent. Therefore, the solubility of the first functional material in the first solvent is reduced to be less than the solubility of the first light-emitting material in the first solvent.

The solubility of the first functional material in the first solvent may be reduced by selecting ligands with a suitable chain length. In some embodiments, the chain length of the third ligands is less than the chain length of the first photosensitive ligands. Generally, the shorter a chain length of ligands is, the poorer a solubility of the ligands in an oily solvent is. Thus, by having the solubility of the third ligands in the first solvent to be less than the solubility of the first ligand in the first solvent, the solubility of the first functional material in the first solvent may be less than the solubility of the first light-emitting material in the first solvent.

The solubility of the first functional material in the first solvent may also be reduced by selecting ligands having a suitable functional group. For example, in some embodiments, the first photosensitive ligand and the first solvent include at least one same functional group. In addition, the more same functional groups the first photosensitive ligand include, the easier it is for the first photosensitive ligand to be miscible with the first solvent. The third ligand and the first solvent include no same functional group, or a number of same functional groups between the third ligand and the first solvent is less than a number of the same functional groups between the first photosensitive ligand and the first solvent. As a result, the solubility of the first functional material in the first solvent is less than the solubility of the first light-emitting material in the first solvent.

The solubility of the first functional material in the first solvent may also be reduced by selecting ligands having a suitable number of branch chains. A longest chain on a ligand is a main chain of the ligand, and remaining chain(s) connected to the main chain on the ligand are branch chain(s). A chain length of the ligand actually refers to a length of the main chain. For example, in some embodiments, the chain length of the first photosensitive ligand is equal to or approximately equal to the chain length of the third ligand, and a number of branch chains of the first photosensitive ligand is greater than a number of branch chains of the third ligand. Generally, a solubility of a ligand having a large amount of branch chains has a good solubility in an organic solvent. As a result, the solubility of the first functional material in the first solvent is less than the solubility of the first light-emitting material in the first solvent.

In some embodiments, the chain length of the third ligands is less than the chain length of the first photosensitive ligands. Generally, the shorter a chain length of ligands is, the poorer a solubility of the ligands in an oily solvent is. Thus, by having the solubility of the third ligands in the first solvent to be less than the solubility of the first ligand in the first solvent, the solubility of the first functional material in the first solvent may be less than the solubility of the first light-emitting material in the first solvent.

In some embodiments, the particle diameter of the first functional particles 221 is less than the particle diameter of the first light-emitting particles 231. For technical effects thereof, reference may be made to the corresponding description of the technical effects of the light-emitting substrate 1, which will not be repeated here.

In some embodiments, the particle diameter of the first functional particles 221 is in a range of 2 nm to 7 nm, inclusive. For technical effects thereof, reference may be made to the corresponding description of the technical effects of the light-emitting substrate 1, which will not be repeated here.

In some embodiments, for the first functional particles 221, the ratio of the number of the second photosensitive ligands to the sum of the number of the second photosensitive ligands and the number of the third ligands is in the range of 1/2 to 2/3, inclusive. For technical effects thereof, reference may be made to the corresponding description of the technical effects of the light-emitting substrate 1, which will not be repeated here.

In some embodiments, the first light-emitting particles 231 are CdS particles, CdSe particles, InP particles, ZnSe particles, PbS particles, $CsPbCl_3$ particles, $CsPbBr_3$ particles, $CsPbI_3$ particles, CdS/ZnS particles, CdSe/ZnS particles, PbS/ZnS particles, InP/ZnS particles, $CsPbCl_3$/ZnS particles, $CsPbBr_3$/ZnS particles or $CsPbI_3$/ZnS particles. For technical effects thereof, reference may be made to the corresponding description of the technical effects of the light-emitting substrate 1, which will not be repeated here.

In some embodiments, the first functional particles 221 are N-type semiconductors, P-type semiconductors or insulators. For technical effects thereof, reference may be made to the corresponding description of the technical effects of the light-emitting substrate 1, which will not be repeated here.

In some embodiments, in the solution containing the light-emitting material, a ratio of a number of the first light-emitting particles 231 to a number of the first functional particles 221 is in a range of 66/100 to 80/100, inclusive. For technical effects thereof, reference may be made to the corresponding description of the technical effects of the light-emitting substrate 1, which will not be repeated here.

Some embodiments of the present disclosure provide a method for manufacturing the light-emitting substrate 1. With reference to FIG. 5, the method includes the following steps.

In a step (S11), the first electrode 210 is formed on the substrate 10.

A material of the first electrode 210 may be determined depending on the type of the light-emitting substrate 1. A first conductive layer may be formed on the substrate 10, and then the first conductive layer may be exposed, developed or etched to obtain the first electrode 210.

In a step (S12), the first functional layer 220 and the first light-emitting pattern 230 are formed on a side of the first electrode 210 away from the substrate 10. The first light-emitting pattern 230 is mainly composed of the first light-emitting material. The first light-emitting material includes the first light-emitting particles 231 and the first ligands combined with the first light-emitting particles 231. The first functional layer 220 is mainly composed of the first functional material. The first functional material includes the first functional particles 221 and the second ligands combined with the first functional particles 221. The development characteristic of the first ligands is the same as the development characteristic of the second ligands.

In a step (S13), the second electrode 240 is formed on a side of the first light-emitting pattern 230 away from the substrate 10. The first electrode 210, the first functional layer 220, the first light-emitting pattern 230 and the second electrode 240 constitute the first light-emitting device 20.

The method for manufacturing the light-emitting substrate 1 may achieve the same beneficial effects as the light-emitting substrate 1 described above, which will not be repeated here.

In some embodiments, with reference to FIGS. 6 and 7, the step that the first functional layer 220 and the first light-emitting pattern 230 are on the side of the first electrode 210 away from the substrate 10 includes the following steps.

A coating process of the first mixture solution is performed on the side of the first electrode 210 away from the substrate 10 to obtain the first mixture film 60. The first mixture solution includes the first solvent and the first initial light-emitting material and the first initial functional material dissolved in the first solvent. The first initial light-emitting material includes the first light-emitting particles 231 and the first photosensitive ligands combined with the first light-emitting particles 231. The first initial functional material includes the first functional particles 221 and the second photosensitive ligands combined with the first functional particles 221. The photosensitive characteristic of the first photosensitive ligands is the same as the photosensitive characteristic of the second photosensitive ligands. The migration rate of the first initial functional material in the first solvent is greater than the migration rate of the first initial light-emitting material in the first solvent.

The first mixture film 60 is exposed, by using a mask, and developed to obtain the first functional layer 220 and the first light-emitting pattern 230.

With reference to FIG. 6, in this case, a film forming process is only needed to be performed once through coating to obtain the first mixture film 60. With reference to FIGS. 7 and 8, for specific steps and technical effects of film forming through coating, exposure and development, reference may be made to corresponding description of the light-emitting substrate 1, which will not be repeated here. For the first light-emitting particle 231, the first photosensitive ligands, the first functional particles 221, the second photosensitive ligands and the first solvent, reference may be made to corresponding description of the light-emitting substrate 1, which will not be repeated here.

In some embodiments, a solubility of the first initial functional material in the first solvent is less than a solubility of the first initial light-emitting material in the first solvent. For a specific material of the first initial functional material, a specific material of the first initial light-emitting material, and technical effects in such cases, reference may be made to corresponding descriptions of the light-emitting substrate 1 and the solution containing the light-emitting material, which will not be repeated herein.

In some embodiments, with reference to FIG. 7, the step that the first mixture film 60 is exposed, by using the mask, and developed to obtain the first functional layer 220 and the first light-emitting pattern 230 includes the following steps.

Exposure is performed on the first mixture film 60 by the mask. First photosensitive ligands and second photosensitive ligands of the first mixture film 60 located in first regions 20A are respectively produced first optically variable ligands and second optically variable ligands under light irradiation. A first region 20A is a region where the first light-emitting device 20 is located.

Portions of the first mixture film 60 located outside the first regions 20A are removed by a first developing solution after the exposure to obtain the first functional layer 220 and the first light-emitting pattern 230. A solubility of the first photosensitive ligands in the first developing solution is greater than a solubility of the first optically variable ligands in the first developing solution. A solubility of the second photosensitive ligands in the first developing solution is greater than a solubility of the second optically variable ligands in the first developing solution.

In this case, openings of the mask correspond to the first light-emitting pattern 230. Exposed regions of the first mixture film 60 are the first regions 20A, i.e., regions where first light-emitting devices 20 are located. The first ligands are first optically variable ligands, and the second ligands are second optically variable ligands. For specific steps, reference is made to FIG. 7 and corresponding description of the light-emitting substrate 1, which will not be repeated here.

In some embodiments, with reference to FIG. 8, the step that the first mixture film 60 is exposed, by using the mask, and developed to obtain the first functional layer 220 and the first light-emitting pattern 230 includes the following steps.

Exposure is performed on the first mixture film 60 by the mask. First photosensitive ligands and second photosensitive ligands located beyond the first regions 20A are respectively produced first photosensitive ligands and second photosensitive ligands under light irradiation. The first region 20A is a region where the first light-emitting device 20 is located.

Exposed portions of the first mixture film 60 located outside the first regions 20A are dissolved and removes by using a second developing solution to obtain the first functional layer 220 and the first light-emitting pattern 230. A solubility of the first photosensitive ligands in the second developing solution is less than a solubility of the first optically variable ligands in the second developing solution. A solubility of the second photosensitive ligands in the second developing solution is less than a solubility of the second optically variable ligands in the second developing solution.

In this case, openings of the mask do not correspond to the first light-emitting pattern 230. The exposed regions of the first mixture film 60 are regions beyond the first regions 20A, i.e., regions without the first light-emitting devices 20. The first ligands are the first photosensitive ligands, and the second ligands are the second photosensitive ligands. For specific steps, reference is made to FIG. 8 and corresponding description of the light-emitting substrate 1, which will not be repeated here.

In some embodiments, with reference to FIG. 9, the step that the first functional layer 220 and the first light-emitting pattern 230 are on the side of the first electrode 210 away from the substrate 10 includes the following steps.

A first functional film 71 is formed on the side of the first electrode 210 away from the substrate 10. A material of the first functional film 71 includes a first functional material. The first functional material includes first functional particles 221 and second photosensitive ligands combined with the first functional particles 221.

A first light-emitting film 72 is formed on a side of the first functional film 71 away from the substrate 10. A material of the first light-emitting film 72 includes a first light-emitting material. The first light-emitting material includes first light-emitting particles 231 and first photosensitive ligands combined with the first light-emitting particles 231. A photosensitive characteristic of the first photosensitive ligands is same as a photosensitive characteristic of the second photosensitive ligands.

The first functional film 71 and the first light-emitting film 72 are exposed, by using a mask, and developed to obtain the first functional layer 220 and the first light-emitting pattern 230.

In this case, a film forming process is performed twice. For example, a coating process (e.g., a spin coating process) of the first functional solution is performed to obtain the first functional film 71. Then, on the first functional film 71, a coating process (e.g., a spin coating process) of with the first light-emitting solution is performed to obtain the first light-emitting film 72. With reference to FIGS. 7 and 8, for specific steps and technical effects of film forming through coating, exposure and development, reference may be made to the corresponding description of the light-emitting substrate 1, which will not be repeated here.

In some embodiments, the step that the first functional film 71 and the first light-emitting film 72 are exposed, by using the mask, and developed to obtain the first functional layer 220 and the first light-emitting pattern 230 includes the following steps.

Exposure is performed on the first functional film 71 and the first light-emitting film 72 by the mask. The first photosensitive ligands and the second photosensitive ligands, located in the first regions 20A, of the first functional film 71 and the first light-emitting film 72 respectively produce the first optically variable ligands and the second optically variable ligands under light irradiation. The first region 20A is the region where the first light-emitting device 20 is located.

Exposed portions, located outside the first regions 20A, of the first functional film 71 and the first light-emitting film 72 are dissolved and removed by using a third developing solution to obtain the first functional layer 220 and the first light-emitting pattern 230. A solubility of the first photosensitive ligands in the third developing solution is greater than a solubility of the first optically variable ligands in the third developing solution. A solubility of the second photosensitive ligands in the third developing solution is greater than a solubility of the second optically variable ligands in the third developing solution.

In this case, the openings of the mask correspond to the first light-emitting pattern 230. The exposed regions of the first functional film 71 and the first light-emitting film 72 are the first regions 20A, i.e., the regions where the first light-emitting devices 20 are located. The first ligands are the first optically variable ligands, and the second ligands are the second optically variable ligands. For specific steps, reference is made to FIG. 7 and the corresponding description of the light-emitting substrate 1, which will not be repeated here. It will be noted that, the third developing solution and the first developing solution are of a same type, and both used for washing a material in the non-exposed regions away. The third developing solution and the first developing solution may be same as or different from each other.

In some embodiments, the step that the first functional film 71 and the first light-emitting film 72 are exposed, by using the mask, and developed to obtain the first functional layer 220 and the first light-emitting pattern 230 includes the following steps.

Exposure is performed on the first functional film 71 and the first light-emitting film 72 by using the mask. The first photosensitive ligands and the second photosensitive ligands, located outside the first regions 20A, of the first functional film 71 and the first light-emitting film 72 respectively produce the first optically variable ligands and the second optically variable ligands under light irradiation. The first region 20A is the region where the first light-emitting device 20 is located.

Exposed portions, located outside the first regions 20A, of the first functional film 71 and the first light-emitting film 72 are dissolved and removed by using a fourth developing solution to obtain the first functional layer 220 and the first light-emitting pattern 230. A solubility of the first photosensitive ligands in the fourth developing solution is less than a solubility of the first optically variable ligands in the fourth developing solution. A solubility of the second photosensitive ligands in the fourth developing solution is less than a solubility of the second optically variable ligands in the fourth developing solution.

In this case, the openings of the mask do not correspond to the first light-emitting pattern 230. The exposed regions of the first functional film 71 and the first light-emitting film 72 are the regions outside the first regions 20A, i.e., the regions without the first light-emitting devices 20. The first ligands are the first photosensitive ligands, and the second ligands are the second photosensitive ligands. For specific steps, reference is made to FIG. 8 and the corresponding description of the light-emitting substrate 1, which will not be repeated here.

In some embodiments, with reference to FIG. 11, the method further includes the following steps.

The third electrode 410 is formed on the substrate 10.

The second functional layer 420 and the second light-emitting pattern 430 are formed on a side of the third electrode 410 away from the substrate 10. A material of the second light-emitting pattern 430 includes the second light-emitting material. The second light-emitting material includes the second light-emitting particles 431 and the fourth ligands combined with the second light-emitting particles 431. The second functional layer 420 includes the second functional material. The second functional material includes the second functional particles 421 and the fifth ligands combined with the second functional particles 421.

The development characteristic of the fourth ligands is the same as the development characteristic of the fifth ligands.

The fourth electrode 440 is formed on a side of the second light-emitting pattern 430 away from the substrate 10. The third electrode 410, the second functional layer 420, the second light-emitting pattern 430 and the fourth electrode 440 constitute the second light-emitting device 40.

For a method for forming the second light-emitting device 40, reference may be made to the method for forming the first light-emitting device 20. For example, the single-layer preparation process or the layer-by-layer preparation process is applied in a film forming step, and a positive photolithography method or a negative photolithography method is applied in exposure and development steps. For the second light-emitting particles 431, the fourth ligands, the second functional particles 421 and the fifth ligands, reference may be made to the corresponding description of the light-emitting substrate 1, which will not be repeated here.

In some embodiments, with reference to FIGS. 12 and 13, the method further includes the following steps.

The fifth electrode 510 is formed on the substrate 10.

The third functional layer 520 and the third light-emitting pattern 530 are formed on the side of the fifth electrode 510 away from the substrate 10. A material of the third light-emitting pattern 530 includes the third light-emitting material. The third light-emitting material includes the third light-emitting particles 531 and the seventh ligands combined with the third light-emitting particles 531. The material of the third functional layer 520 includes the third functional material. The third functional material includes the third functional particles 521 and the eighth ligands combined with the third functional particles 521. The development characteristic of the seventh ligands is the same as the development characteristic of the eighth ligands.

The sixth electrode 540 is formed on a side of the third light-emitting pattern 530 away from the substrate 10. The fifth electrode 510, the third functional layer 520, the third light-emitting pattern 530 and the sixth electrode 540 constitute the third light-emitting device 50.

For a method for forming the third light-emitting device 50, reference may be made to the method for forming the first light-emitting device 20. For example, the single-layer preparation process or the layer-by-layer preparation process is applied in a film forming step, and a positive photolithography method or a negative photolithography method is applied in exposure and development steps. For the third light-emitting particles 531, the seventh ligands, the third functional particles 521 and the eighth ligands, reference may be made to the corresponding description of the light-emitting substrate 1, which will not be repeated here.

Some embodiments of the present disclosure provide a light-emitting apparatus. The apparatus included the light-emitting substrate 1. The light-emitting apparatus may achieve the beneficial effects that the light-emitting substrate 1 achieves, which will not be repeated here.

Hereinafter, the present disclosure is further explained in conjunction with specific embodiments. However, the present disclosure is not limited to the following embodiments.

Example 1

With reference to FIGS. 8, 11 and 13, steps for forming light-emitting devices which have an inverted bottom-emission structure are as follows.

A substrate with ITO as a common cathode of the first light-emitting device 20, the second light-emitting device 40 and the third light-emitting device 50, is prepared in advance.

Washing is performed sequentially with water, ethanol and acetone, and then drying is performed with a nitrogen gun for subsequent use.

Spin coating is performed to form a ZnO layer as a common auxiliary functional layer 30 of the first light-emitting device 20, the second light-emitting device 40 and the third light-emitting device 50.

A spin coating process of the first mixture solution is performed to obtain the first mixture film 60. The first mixture solution includes the first light-emitting particles 231 and the first functional particles 221. The first light-emitting particles 231 (quantum dots for emitting red light) are combined with the first ligands (which are photosensitive ligands). The first functional particles 221 are combined with the second ligands (which are photosensitive ligands) and the third ligands (which are photosensitive ligands or non-photosensitive ligands).

A first mask is used to perform alignment, exposure and development, and first light-emitting particles 231 in a sub-pixel region of the second light-emitting device 40 and a sub-pixel region of the third light-emitting device 50 are eluted to form the first light-emitting pattern 230 (corresponding to a sub-pixel for red light).

A spin coating of a second mixture solution is performed to obtain a second mixture film 80. The second mixture solution includes the second light-emitting particles 431 and the second functional particles 421. The second light-emitting particles 431 (quantum dots for emitting green light) are combined with the fourth ligands (which are photosensitive ligands). The second functional particles 421 are combined with the fifth ligands (which are photosensitive ligands) and the sixth ligands (which are photosensitive ligands or non-photosensitive ligands).

A second mask is used to perform alignment, exposure and development, and the second light-emitting particles 431 in a sub-pixel region of the first light-emitting device 20 and the sub-pixel region of the third light-emitting device 50 are eluted to form the second light-emitting pattern 430 (corresponding to a sub-pixel for green light).

A spin coating process of a third mixture solution is performed to obtain a third mixture film 90. The third mixture solution includes the third light-emitting particles 531 and the third functional particles 521. The third light-emitting particles 531 (quantum dots for emitting blue light) are combined with the seventh ligands (which are photosensitive ligands). The third functional particles 521 are combined with the eighth ligands (which are photosensitive ligands) and the ninth ligands (which are photosensitive ligands or non-photosensitive ligands).

A third mask used to perform alignment, exposure and development, and the third light-emitting particles 531 in the sub-pixel region of the first light-emitting device 20 and the sub-pixel region of the second light-emitting device 40 are eluted to form the third light-emitting pattern 530 (corresponding to a sub-pixel for blue light).

Finally, a hole transport layer, a hole injection layer and a Ag electrode are evaporated, and the devices are encapsulated.

Example 2

With reference to FIGS. 8, 11 and 13, steps for forming light-emitting devices that have an upright bottom-emission structure are as follows.

A substrate with ITO as a common anode of the first light-emitting device 20, the second light-emitting device 40 and the third light-emitting device 50, is prepared in advance.

Washing is performed sequentially with water, ethanol and acetone, and then drying is performed with a nitrogen gun for subsequent use.

A hole injection layer is evaporated.

Spin coating is performed to form a $NiO_x$ layer as a hole transport layer. That is, the first light-emitting device 20, the second light-emitting device 40 and the third light-emitting device 50 share an auxiliary functional layer 30.

A spin coating process of the first mixture solution is performed to obtain the first mixture film 60. The first mixture solution includes the first light-emitting particles 231 and the first functional particles 221. The first light-emitting particles 231 (quantum dots for emitting red light) are combined with the first ligands (which are photosensitive ligands). The first functional particles 221 are combined with the second ligands (which are photosensitive ligands) and the third ligands (which are photosensitive ligands or non-photosensitive ligands).

A first mask is used to perform alignment, exposure and development, and the first light-emitting particles 231 in a sub-pixel region of the second light-emitting device 40 and a sub-pixel region of the third light-emitting device 50 are eluted to form the first light-emitting pattern 230 (corresponding to a sub-pixel for red light).

A spin coating process of a second mixture solution is performed to obtain a second mixture film 80. The second mixture solution includes the second light-emitting particles 431 and the second functional particles 421. The second light-emitting particles 431 (quantum dots for emitting green light) are combined with the fourth ligands (which are photosensitive ligands). The second functional particles 421 are combined with the fifth ligands (which are photosensitive ligands) and the sixth ligands (which are photosensitive ligands or non-photosensitive ligands).

A second mask is used to perform alignment, exposure and development, and second light-emitting particles 431 in a sub-pixel region of the first light-emitting device 20 and the sub-pixel region of the third light-emitting device 50 are eluted to form the second light-emitting pattern 430 (corresponding to a sub-pixel for green light).

A spin coating process of a third mixture solution is performed to obtain the third mixture film 90. The third mixture solution includes the third light-emitting particles 531 and the third functional particles 521. The third light-emitting particles 531 (quantum dots for emitting blue light) are combined with the seventh ligands (which are photosensitive ligands). The third functional particles 521 are combined with the eighth ligands (which are photosensitive ligands) and the ninth ligands (which are photosensitive ligands or non-photosensitive ligands).

A third mask used to perform alignment, exposure and development, and third light-emitting particles 531 in the sub-pixel region of the first light-emitting device 20 and the sub-pixel region of the second light-emitting device 40 are eluted to form the third light-emitting pattern 530 (corresponding to a sub-pixel for blue light).

Spin coating is performed, for example, with ZnO nanoparticles or $TiO_2$ nanoparticles, to form an electron transport layer. Then evaporation deposition is performed to form a metal thin layer as a cathode. The cathode may be made of Al, Ag or some other metal, and has a thickness of approximately 100 nm to 500 nm, inclusive. Finally, the devices are encapsulated.

Example 3

With reference to FIGS. 8, 11 and 13, steps for forming QLED devices which have an inverted bottom-emission structure are as follows.

A substrate with ITO as a common cathode of the first light-emitting device 20, the second light-emitting device 40 and the third light-emitting device 50, is prepared in advance.

Washing is performed sequentially with water, ethanol and acetone, and then drying is performed with a nitrogen gun for subsequent use.

Spin coating is performed to form a ZnO layer as a common auxiliary functional layer 30 of the first light-emitting device 20, second light-emitting device 40 and the third light-emitting device 50.

A spin coating process of the first mixture solution is performed to obtain the first mixture film 60. The first mixture solution includes the first light-emitting particles 231 and the first functional particles 221. The first light-emitting particles 231 (quantum dots for emitting red light) are combined with the first ligands (which are photosensitive ligands). The first functional particles 221 are combined with the second ligands (which are photosensitive ligands) and the third ligands (which are photosensitive ligands or non-photosensitive ligands).

A first mask is used to perform alignment, exposure and development, and first light-emitting particles 231 in a sub-pixel region of the second light-emitting device 40 and a sub-pixel region of the third light-emitting device 50 are eluted to form the first light-emitting pattern 230 (corresponding to a sub-pixel for red light).

A spin coating process of a second mixture solution is performed to obtain a second mixture film 80. The second mixture solution includes the second light-emitting particles 431 and the second functional particles 421. The second light-emitting particles 431 (quantum dots for emitting green light) are combined with the fourth ligands (which are photosensitive ligands). The second functional particles 421 are combined with the fifth ligands (which are photosensitive ligands) and the sixth ligands (which are photosensitive ligands or non-photosensitive ligands).

A second mask is used to perform alignment, exposure and development, and the second light-emitting particles 431 in a sub-pixel region of the first light-emitting device 20 and the sub-pixel region of the third light-emitting device 50 are eluted to form the second light-emitting pattern 430 (corresponding to a sub-pixel for green light).

A spin coating process of a third mixture solution is performed to obtain the third mixture film 90. The third mixture solution includes the third light-emitting particles 531 and the third functional particles 521. The third light-emitting particles 531 (quantum dots for emitting blue light) are combined with the seventh ligands (which are photosensitive ligands). The third functional particles 521 are combined with the eighth ligands (which are photosensitive ligands) and the ninth ligands (which are photosensitive ligands or non-photosensitive ligands).

A third mask used to perform alignment, exposure and development, and the third light-emitting particles 531 in the sub-pixel region of the first light-emitting device 20 and the sub-pixel region of the second light-emitting device 40 are eluted to form the third light-emitting pattern 530 (corresponding to a sub-pixel for blue light).

Finally, a hole transport layer, a hole injection layer and a Ag electrode are evaporated, and the devices are encapsulated.

Verification Test:

The first mixture solution is prepared by ligand exchange. The first mixture solution is a mixture of green quantum dot-Boc and NiO-AB (abbreviated as GQD-Boc/NiO-AB). In GQD-Boc, "GQD" is a first light-emitting particle, and the first light-emitting particle is a quantum dot for emitting green light; and "Boc" is a first ligand (i.e., a ligand Boc). In NiO-AB, "NIO" is a first functional particle; and "A" represents a second ligand, and for example, the second ligand is a ligand Boc; and "B" represents a third ligand, and for example, the third ligand is ethiol.

Next, a first white glass is spin coated with ZnO (having a thickness of about 25 nm) and GQD-Boc/NiO-AB (having a thickness of about 30 nm). Then, GQD-Boc/NiO-AB is exposed by using chloroform, and UV-visible absorption spectra of ZnO and ZnO/GQD-Boc/NiO-AB/CCl$_3$ are tested.

Similarly, a second white glass is spin coated with ZnO (having a thickness of about 25 nm) and GQD-Boc (having a thickness of about 30 nm) in sequence, and then ZnO and GQD-Boc (ZnO/GQD-Boc) are developed by using chloroform, and a UV-visible absorption spectrum of ZnO/GQD-Boc/CCl$_3$ is tested.

The UV-visible absorption spectrum of ZnO refers to a UV-visible absorption spectrum of a film layer obtained after the first white glass is spin coated thereon with ZnO; and the UV-visible absorption spectrum of ZnO/GQD-Boc/NiO-AB/CCl$_3$ refers to a UV-visible absorption spectrum of a film layer obtained by spin coating the first white glass sequentially with ZnO and GQD-Boc/NiO-AB thereon in sequence and then dissolving GQD-Boc/NiO-AB by using chloroform. The UV-visible absorption spectrum of ZnO/GQD-Boc/CCl$_3$ refers to a UV-visible absorption spectrum of a film layer obtained by spin coating the second white glass sequentially with ZnO and GQD-Boc in sequence thereon and then dissolving GQD-Boc by using chloroform.

Figure 14:
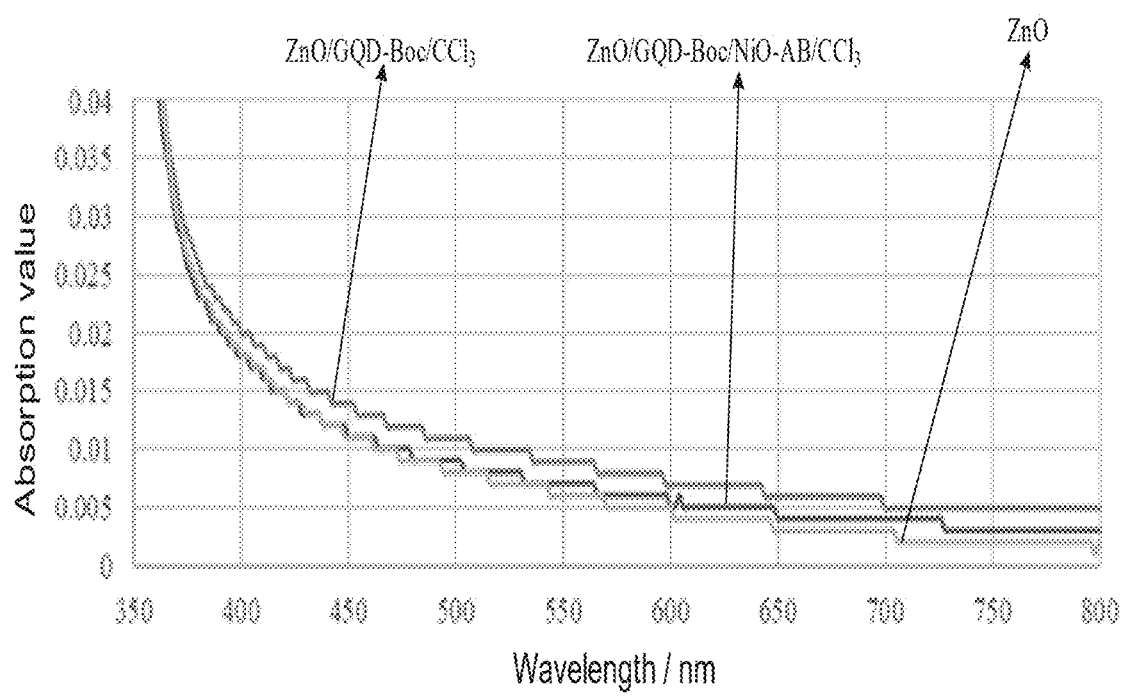
FIG. 14 is a comparison plot of ultraviolet-visible absorption spectra of ZnO, ZnO/green quantum dot-2-(tert-butoxycarbonyl-amino) ethanethiol/$CCl_3$ (abbreviated as ZnO/GQD-Boc/$CCl_3$ herein), and ZnO green quantum dot-2-(tert-butoxycarbonyl-amino) NIO-AB $CCl_3$ (abbreviated as ZnO/GQD-Boc/NiO-AB/$CCl_3$ herein), in accordance with some embodiments.

Test results of the UV-visible absorption spectra of the film layers are as shown in FIG. 14. As can be seen from FIG. 14, compared with the UV-visible absorption spectrum of ZnO, an absorption value of ZnO/GQD-Boc/NiO-AB/CCl$_3$ in a wavelength range of 450 nm to 750 nm is closer to or even slightly less than an absorption value of ZnO in the wavelength range of 450 nm to 750 nm. An absorption value of ZnO/GQD-Boc/CCl$_3$ in the wavelength range of 450 nm to 750 nm is significantly greater than the absorption value of ZnO in the wavelength range of 450 nm to 750 nm. This indicates that residuals of GQDs on a surface of ZnO are minimal after ZnO/GQD-Boc/NiO-AB is developed.

Figure 15:
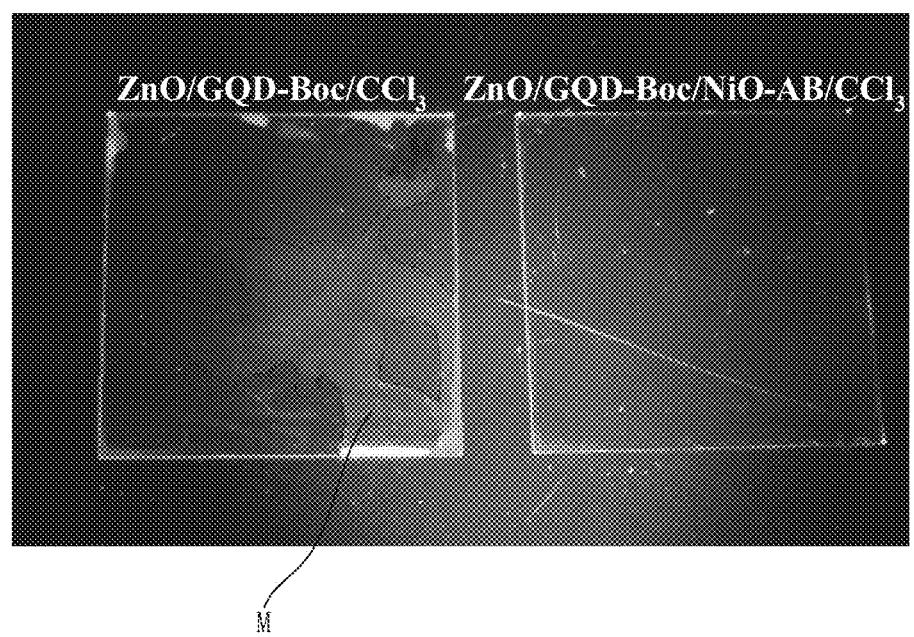
FIG. 15 is a diagram showing optical effects of ZnO/GQD-Boc/$CCl_3$ and ZnO/GQD-Boc/NiO-AB/$CCl_3$ under ultraviolet irradiation, in accordance with some embodiments.

In addition, test results by irradiating ZnO/GQD-Boc/CCl$_3$ and ZnO/GQD-Boc/NiO-AB/CCl$_3$ by an UV lamp are shown in FIG. 15. As can be seen from FIG. 15 that, residues are invisible to a naked eye under irradiation of UV light after development of ZnO/GQD-Boc/NiO-AB/CCl$_3$ (as shown on a glass substrate on right in FIG. 15), while a large amount of residues are visible under irradiation of UV light after development of ZnO/GQD-Boc/CCl$_3$ (as shown on a glass substrate on left in FIG. 15), with reference to a residual region M in FIG. 15.

To sum up, by providing the first functional layer on the first light-emitting pattern, the problem of residues of quantum dots existing in the direct photolithography method may be solved.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims. Therefore, the protection scope of the present disclosure shall be subject to the protection scope of the claims.

What is claimed is:

1. A light-emitting substrate, comprising:
   a substrate, and
   a first light-emitting device, wherein the first light-emitting device includes a first electrode, a first functional layer, a first light-emitting pattern and a second electrode that are sequentially disposed in a direction away from the substrate, and the first functional layer is in contact with the first light-emitting pattern,
   wherein the first light-emitting pattern includes a first light-emitting material, and the first light-emitting material includes first light-emitting particles and first ligands combined with the first light-emitting particles; the first functional layer includes a first functional material, and the first functional material includes first functional particles and second ligands combined with the first functional particles; and a development characteristic of the first ligands is same as a development characteristic of the second ligands; and
   the first functional layer further includes third ligands; the third ligands are combined with the first functional particles; and a chain length of the third ligands is less than a chain length of the first ligands; or the chain length of the third ligands is less than a chain length of first photosensitive ligands, and the first ligands are products of the first photosensitive ligands under light irradiation.

2. The light-emitting substrate according to claim 1, wherein a particle diameter of the first functional particles is less than a particle diameter of the first light-emitting particles.

3. The light-emitting substrate according to claim 1, wherein
   for the first functional particles, a ratio of a number of the second ligands to a sum of the number of the second ligands and a number of the third ligands is in a range of 1/2 to 2/3, inclusive.

4. The light-emitting substrate according to claim 1, wherein a ratio of a thickness of the first functional layer to a thickness of the first light-emitting pattern is in a range of 1/3 to 1/5, inclusive; and/or
   a ratio of a number of the first light-emitting particles of the first light-emitting pattern to a number of the first functional particles of the first functional layer is in a range of 66/100 to 80/100, inclusive.

5. The light-emitting substrate according to claim 1, wherein both the first ligands and the second ligands are photosensitive ligands;
   or
   both the first ligands and the second ligands are products of respective photosensitive ligands under light irradiation.

6. The light-emitting substrate according to claim 1, further comprising an auxiliary functional layer, wherein the auxiliary functional layer is located between the first electrode and the first functional layer.

7. The light-emitting substrate according to claim 1, further comprising a second light-emitting device, wherein the second light-emitting device includes a third electrode, a second functional layer, a second light-emitting pattern and a fourth electrode that are sequentially disposed in the direction away from the substrate, and the second functional layer is in contact with the second light-emitting pattern,
wherein the second light-emitting pattern includes a second light-emitting material, and the second light-emitting material includes second light-emitting particles and fourth ligands combined with the second light-emitting particles; the second functional layer includes a second functional material, and the second functional material includes second functional particles and fifth ligands combined with the second functional particles; and a development characteristic of the fourth ligands is same as a development characteristic of the fifth ligands.

8. The light-emitting substrate according to claim 7, wherein the second functional layer further includes sixth ligands, the sixth ligands are combined with the second functional particles, and a chain length of the sixth ligands is less than a chain length of the fourth ligands; and/or
the first light-emitting device further includes a first material layer, the first material layer is located on a surface of the first light-emitting pattern away from the substrate, and a material of the first material layer is same as the second functional material.

9. The light-emitting substrate according to claim 1, further comprising a third light-emitting device, wherein
the third light-emitting device includes a fifth electrode, a third functional layer, a third light-emitting pattern and a sixth electrode that are sequentially disposed in the direction away from the substrate, and the third functional layer is in contact with the third light-emitting pattern,
wherein the third light-emitting pattern includes a third light-emitting material, and the third light-emitting material includes third light-emitting particles and seventh ligands combined with the third light-emitting particles; the third functional layer includes a third functional material, and the third functional material includes third functional particles and eighth ligands combined with the third functional particles; and a development characteristic of the seventh ligands is same as a development characteristic of the eighth ligands.

10. The light-emitting substrate according to claim 9, wherein the third functional layer further includes ninth ligands, the ninth ligands are combined with the third functional particles, and a chain length of the ninth ligands is less than a chain length of the seventh ligands.

11. The light-emitting substrate according to claim 9, further comprising a second light-emitting device, wherein the second light-emitting device includes a third electrode, a second functional layer, a second light-emitting pattern and a fourth electrode that are sequentially disposed in the direction away from the substrate; the second functional layer is in contact with the second light-emitting pattern; the second light-emitting pattern includes a second light-emitting material; the second light-emitting material includes second light-emitting particles and fourth ligands combined with the second light-emitting particles; the second functional layer includes a second functional material; the second functional material includes second functional particles and fifth ligands combined with the second functional particles; and a development characteristic of the fourth ligands is same as a development characteristic of the fifth ligands;
the second light-emitting device further includes a second material layer, the second material layer is located on a surface of a second light-emitting pattern away from the substrate, and a material of the second material layer is same as a material of the third functional layer; and/or
a particle diameter of the first light-emitting particles and a particle diameter of the second light-emitting particles in the second light-emitting device are both greater than a particle diameter of the third light-emitting particles; and the first functional particles and the second functional particles of the second light-emitting device are P-type semiconductors, and the third functional particles are N-type semiconductors.

12. A solution containing a light-emitting material, comprising a first solvent and a first initial light-emitting material and a first initial functional material that are dissolved in the first solvent, wherein
the first initial light-emitting material includes first light-emitting particles and first photosensitive ligands combined with the first light-emitting particles; and
the first initial functional material includes first functional particles and second photosensitive ligands combined with the first functional particles,
wherein a photosensitive characteristic of the first photosensitive ligands is same as a photosensitive characteristic of the second photosensitive ligands; and a migration rate of the first initial functional material in the first solvent is greater than a migration rate of the first initial light-emitting material in the first solvent;
the solution containing the light-emitting material further comprising third ligands, wherein
the third ligands are combined with the first functional particles, and a solubility of the third ligands in the first solvent is less than a solubility of the first photosensitive ligands in the first solvent; or
the third ligands are combined with the first functional particles; the solubility of the third ligands in the first solvent is less than the solubility of the first photosensitive ligands in the first solvent; and a chain length of the third ligands is less than a chain length of the first photosensitive ligands.

13. The solution containing the light-emitting material according to claim 12, wherein a solubility of the first initial functional material in the first solvent is less than a solubility of the first initial light-emitting material in the first solvent; and/or
a particle diameter of the first functional particles is less than a particle diameter of the first light-emitting particles.

14. A method for manufacturing a light-emitting substrate, comprising:
forming a first electrode on a substrate;
forming a first functional layer and a first light-emitting pattern on a side of the first electrode away from the substrate, wherein
the first functional layer is in contact with the first light-emitting pattern, the first light-emitting pattern includes a first light-emitting material, and the first light-emitting material includes first light-emitting particles and first ligands combined with the first light-emitting particles; the first functional layer includes a first functional material, and the first functional material includes first functional particles and second ligands combined with the first functional particles; and a development characteristic of the first ligands is same as a development characteristic of the second ligands; and the first functional layer further includes third ligands; the third ligands are combined with the first functional particles; and a chain length of the third ligands is less than a chain length of the first ligands; or the chain length of the third ligands is less than a chain length of first photosensitive ligands, and the first ligands are products of the first photosensitive ligands under light irradiation; and forming a second electrode on a side of the first light-emitting pattern away from the substrate, wherein the first electrode, the first functional layer, the first light-emitting pattern and the second electrode constitute a first light-emitting device.

15. The method for manufacturing the light-emitting substrate according to claim 14, wherein
forming the first functional layer and the first light-emitting pattern on the side of the first electrode away from the substrate, includes:
forming a first mixture film, by a coating process of a first mixture solution, on the side of the first electrode away from the substrate, wherein the first mixture solution includes a first solvent and a first initial light-emitting material and a first initial functional material that are dissolved in the first solvent; the first initial light-emitting material includes first light-emitting particles and first photosensitive ligands combined with the first light-emitting particles; and the first initial functional material includes first functional particles and second photosensitive ligands combined with the first functional particles, wherein a photosensitive characteristic of the first photosensitive ligands is same as a photosensitive characteristic of the second photosensitive ligands, and a migration rate of the first initial functional material in the first solvent is greater than a migration rate of the first initial light-emitting material in the first solvent; and
performing a exposure, by using a mask, and a development on the first mixture film to obtain the first functional layer and the first light-emitting pattern.

16. The method for manufacturing the light-emitting substrate according to claim 15, wherein
performing the exposure, by using the mask, and the development on the first mixture film to obtain the first functional layer and the first light-emitting pattern, includes:
exposing the first mixture film by using the mask, wherein first photosensitive ligands and second photosensitive ligands, located in a first region, of the first mixture film respectively produce first optically variable ligands and second optically variable ligands under light irradiation, and the first region is a region where the first light-emitting device is located; and
dissolving and removing an portion, located outside the first region, of the first mixture film by using a first developing solution after the exposure to obtain the first functional layer and the first light-emitting pattern, wherein a solubility of the first photosensitive ligands in the first developing solution is greater than a solubility of the first optically variable ligands in the first developing solution, and a solubility of the second photosensitive ligands in the first developing solution is greater than a solubility of the second optically variable ligands in the first developing solution; or performing the exposure, by using the mask, and the development on the first mixture film to obtain the first functional layer and the first light-emitting pattern, includes:
exposing the first mixture film by using the mask, wherein first photosensitive ligands and second photosensitive ligands, located outside the first region, respectively produce first optically variable ligands and second optically variable ligands under light irradiation, and the first region is the region where the first light-emitting device is located; and
dissolving and removing an exposed portion, located outside the first region, of the first mixture film by using a second developing solution, wherein a solubility of the first photosensitive ligands in the second developing solution is less than a solubility of the first optically variable ligands in the second developing solution, and a solubility of the second photosensitive ligands in the second developing solution is less than a solubility of the second optically variable ligands in the second developing solution.

17. The method for manufacturing the light-emitting substrate according to claim 14, further comprising:
forming a third electrode on the substrate;
forming a second functional layer and a second light-emitting pattern on a side of the third electrode away from the substrate, wherein a material of the second light-emitting pattern includes a second light-emitting material, and the second light-emitting material includes second light-emitting particles and fourth ligands combined with the second light-emitting particles; a material of the second functional layer includes a second functional material, and the second functional material includes second functional particles and fifth ligands combined with the second functional particles; and a development characteristic of the fourth ligands is same as a development characteristic of the fifth ligands; and
forming a fourth electrode on a side of the second light-emitting pattern away from the substrate, wherein the third electrode, the second functional layer, the second light-emitting pattern and the fourth electrode constitute a second light-emitting device.

18. The method for manufacturing the light-emitting substrate according to claim 14, further comprising:
forming a fifth electrode on the substrate;
forming a third functional layer and a third light-emitting pattern on a side of the fifth electrode away from the substrate, wherein a material of the third light-emitting pattern is a third light-emitting material, and the third light-emitting material includes third light-emitting particles and seventh ligands combined with the third light-emitting particles; a material of the third functional layer includes a third functional material, and the third functional material includes third functional particles and eighth ligands combined with the third functional particles; and a development characteristic of the seventh ligands is same as a development characteristic of the eighth ligands; and
forming a sixth electrode on a side of the third light-emitting pattern away from the substrate, wherein the fifth electrode, the third functional layer, the third light-emitting pattern and the sixth electrode constitute a third light-emitting device.

19. A display apparatus, comprising the light-emitting substrate according to claim 1.

* * * * *